United States Patent [19]

Gorokhovsky

[11] Patent Number: 5,478,608
[45] Date of Patent: Dec. 26, 1995

[54] ARC ASSISTED CVD COATING METHOD AND APPARATUS

[76] Inventor: Vladimir I. Gorokhovsky, 10 Stonedene Blvd., Willowdale, Ontario, Canada, M2R 3C7

[21] Appl. No.: 338,844

[22] Filed: Nov. 14, 1994

[51] Int. Cl.$^6$ ........................................... B05D 3/06
[52] U.S. Cl. ................... 427/571; 118/50.1; 118/500; 118/623; 118/728; 427/249; 427/255.2; 427/577; 427/580; 427/585; 427/598
[58] Field of Search ................... 427/571, 580, 427/577, 585, 249, 255.2, 598; 118/50.1, 623, 500, 728

[56] References Cited

U.S. PATENT DOCUMENTS

| | | | |
|---|---|---|---|
| 4,471,003 | 9/1984 | Cann | 427/34 |
| 4,471,004 | 9/1984 | Kim | 427/88 |
| 4,487,161 | 12/1984 | Hirata et al. | 118/723 |
| 4,487,162 | 12/1984 | Cann | 118/723 |
| 4,487,163 | 12/1984 | Jobert et al. | 119/1 |
| 4,555,611 | 11/1985 | Moll | 219/121 |
| 4,682,564 | 7/1987 | Cann | 118/620 |
| 4,682,565 | 7/1987 | Carrico | 118/719 |
| 4,725,447 | 2/1988 | Pfender . | |

FOREIGN PATENT DOCUMENTS

| | | | |
|---|---|---|---|
| 0099725A2 | 7/1983 | European Pat. Off. | C23C 13/00 |
| 0099724A2 | 7/1983 | European Pat. Off. | C23C 13/00 |
| 0327051A1 | 2/1989 | European Pat. Off. | C23C 16/26 |
| 1-104777(A) | 4/1989 | European Pat. Off. | C23C 16/50 |
| 1-192794(A) | 8/1989 | European Pat. Off. | C30B 29/04 |
| 0478909A1 | 7/1991 | European Pat. Off. | C23C 16/26 |
| 2351051 | 10/1973 | Sweden | B01J 1/00 |

OTHER PUBLICATIONS

"The Growth of Diamond Films Using a DC-Biased Hot Filament Technique", Hou Li, et al., New Diamond Science and Technology 1991 MRS. Int. Conf. Proc., (no month available).
"Surface Morphologies and Photoluminescence of Diamond Films Deposited in a Hot Filament Reactor", T. Srivinyunon, et al., New Diamond Science and Technology 1991 MRS Int. Conf. Proc., (no month available).
"Thermal diffusivity of diamond films synthesized from methane by arc discharge plasma jet CVD", Boudina et al., Diamond and Related Materials, 2 (1993) 852–8, (no month available).
"Diamond deposition from an Ar–CCl$_4$–H$_2$ plasma jet at 13.3 kPa", Kotaki et al., Diamond and Related Materials, 2 (1993) 324–46, (no month available).
"Plasma–assisted CVD of diamond films by hollow cathode arc discharge", Stiegler et al., Diamond and Related Materials, 2 (1993) 413–16, (no month available).
"Novel Synthesis Routes for Diamond Films in a Heated Flowtube", L. R. Martin et al., New Diamond Science and Technology 1991 MRS Int. Conf Proc., (no month available).
"Thermochemical vapor deposition of diamond in a carbon–halogen–oxygen and/or sulfur atmospheric hot wall (List continued on next page.)

*Primary Examiner*—Bernard Pianalto
*Attorney, Agent, or Firm*—Mark B. Eisen

[57] ABSTRACT

An improved vacuum arc coating apparatus is provided, having a reaction zone with a plasma channel defined within a series of aligned annular substrate holders, or between an outer wall of a chain of substrate holder blocks and the inner wall of the tube. The substrate holders thus act as a liner, confining an arc within the plasma channel. Carrier and plasma creating gases and the reaction species are introduced into the tube, and the deposition process may be carried out at a pressure between 10 Torr and 1000 Torr. Magnetic coils may be used to create a longitudinal magnetic field which focuses the plasma column created by the arc, and to create a transverse magnetic field which is used to bias the plasma column toward the substrates. Substrates can thus be placed anywhere within the reaction zone, and the transverse magnetic field can be used to direct the plasma column toward the substrate, or the tube itself can be rotated to pass the substrate through the plasma column.

23 Claims, 15 Drawing Sheets

OTHER PUBLICATIONS reactor", D. E. Patterson et al., Applications of Diamond Films and Related Materials, Tzeng et al., 1991, (no month available).

Carbon Deposition Using an Expanded Cascaded Arc DC Plasma, J. J. Beulene et al., Surface and Coatings Technology, 47(1991)401–417, published 1991, (no month available).

ARC ASSISTED CVD COATING METHOD AND APPARATUS

FIELD OF INVENTION

This invention relates to an arc coating apparatus. In particular, this invention relates to an arc assisted CVD coating method and apparatus especially suitable for deposition of diamond or other hard coatings or films on a substrate.

BACKGROUND OF THE INVENTION

The deposition of coatings on a substrate is conventionally accomplished using either a plasma torch which creates a plasma plume that envelopes the substrate, such as in the device disclosed in U.S. Pat. No. 4,555,611 to Moll, or an electric arc generated between a cathode and an anode which creates an ionized plasma stream in the vicinity of the substrate. Devices incorporating these methods are well known to those skilled in the art.

The main disadvantage to any apparatus of this type is the limited length of the reaction zone. In the case of for example a plasma jet or plume, such as that described in U.S. Pat. No. 4,555,611 to Moll, the reaction zone is limited by the input power of the source.

In the case of an arc-generated plasma stream, such as that described in European Patent No. 478,909 A1 to Balzers Aktiengesellschaft, the homogeneous reaction zone is limited to the stable portion of the arc, and the ionized plasma tends to be denser in the cathode region. In both cases this severely limits the size of the substrate that can be coated and the quality or uniformity of the coating. Additionally, because the arc is dispersed throughout the apparatus and not well confined, in order to simultaneously process multiple substrates, the deposition process must be carried out at low pressures, reducing plasma density and commensurately reducing the efficiency and rate of deposition.

SUMMARY OF THE INVENTION

The present invention overcomes these disadvantages by providing an arc CVD coating method and an apparatus therefor having a reaction zone of virtually unlimited length. The apparatus also allows considerable flexibility in the positioning of substrates to be coated. This is accomplished in the present invention by creating a homogeneous, concentrated plasma column in a cylindrical reaction tube, configuring the substrate holders to act as a liner confining the arc in a channel containing the substrates, and manipulating the plasma column into contact with the substrates using a combination of longitudinal and transverse magnetic fields.

More specifically, the invention provides an arc assisted CVD coating deposition process in a DC or AC arc column generated in a cylindrical reaction zone. Substrates are positioned either along the wall of the tube, in a cylindrical channel in which the plasma column will be confined created within abutting annular substrate holders, or along the axis of the tube in an annular channel defined between a chain of substrate holder blocks and the wall of the reaction tube. In each case the substrate holders act as a "hot liner", confining the arc within the channel created either within annular substrate holders or between the axially suspended substrate holders and the inner wall of the tube which is water cooled to act as a cool liner. Abutting substrate holders are separated by insulators or narrow dielectric gaps which prevent short circuiting of the arc across conductive substrates or across the conductive surface of a film being deposited on a dielectric substrate.

The length $l_s$ of any continuous surface positioned between insulators must satisfy the formula $$E_c \times l_s < V_c + V_a$$

where
$E_c$ is the charge of the electric field created by the arc,
$l_s$ is the effective length of the substrate,
$V_c$ is the voltage of the cathode, and
$V_a$ is the voltage of the anode.

In one embodiment the apparatus of the invention includes a stabilizing zone defined between a first inlet adjacent to the cathode, for injecting plasma-creating gases and a carrier gas into the tube tangentially to create a rotating column of gas inside the tube, and a second inlet downstream of the first inlet for injecting the reaction species. A third inlet may optionally be provided between the first and second inlets for the injection of liquid or solid reaction species. Means for reducing pressure within the tube, such as a vacuum pump, draws the plasma downstream through the reaction zone and out the anode end of the tube. This embodiment allows for effective mixing of the gases and reaction species, and for ready manipulation of the plasma column over the substrates while keeping it confined in the reaction zone to maximize the efficiency of the arc and provide a high plasma density.

In a further embodiment, groups of annular substrate holders forming self contained reaction sections are provided with openings for the injection of plasma-creating and carrier gases and the reaction species, and for the removal of gases from the reaction zone. In this embodiment the cathode is built into a substrate holder at one end of the reaction section, and a conductive substrate holder at the other end of the reaction section is grounded to form an anode. The reaction zone is formed in the cylindrical channel created within each section of substrate holders. The reaction zone can be extended indefinitely by aligning groups of such reaction sections in abutting relation, each section forming its own arc.

The various embodiments of the invention provide the advantage that the CVD coating process may be carried out at relatively high pressure, between 10 Torr and 1000 Torr. As such, in a still further embodiment of the invention the reaction chamber is sealed once the plasma-creating and carrier gases and the reaction species have been introduced into the reaction zone, and the coating process takes place at atmospheric pressure.

Regulation of the temperature of synthesis is accomplished by regulating the specific power per unit volume of the arc, which is the product of the arc current and the electrical charge of the plasma. Thus, the temperature of synthesis may be controlled by changing the arc current, gas composition or gas pressure within the reaction zone.

Enhancement of the deposition process can be achieved by injecting a second source of energy into the plasma, such as an oscillating electromagnetic signal, to activate the plasma and neutralize the negative charge of the substrate surface, and/or by applying a DC or AC bias voltage to the substrates to increase the intensity of ion bombardment of the substrate surface and improve the quality of the coating.

The present invention thus provides an arc assisted coating apparatus comprising a tube having a reaction zone and at least one inlet for injection of a carrier gas, a plasma-creating gas and a reaction species, a cathode located upstream of the reaction zone, an anode located downstream of the reaction zone, and one or more substrate holders positioned within the reaction zone for supporting a substrate to be coated, whereby a wall of the one or more substrate holders acts as a liner to confine an arc created between the cathode and the anode.

The present invention further provides a method of depositing a coating on a substrate, comprising the steps of positioning a substrate in a cylindrical reaction zone created within at least one annular substrate holder contained in a tube or between at least one annular substrate holder and an inner wall of the tube, introducing a carrier gas and a plasma creating gas into the tube, creating a pressure within the tube between 10 Torr and 1000 Torr, and creating an electric arc between a cathode located in the tube at one end of the reaction zone and an anode located in the tube at another end of the reaction zone.

BRIEF DESCRIPTION OF THE DRAWINGS

In drawings which illustrate by way of example only a preferred embodiment of the present invention.

DETAILED DESCRIPTION OF THE INVENTION

Figure 1:
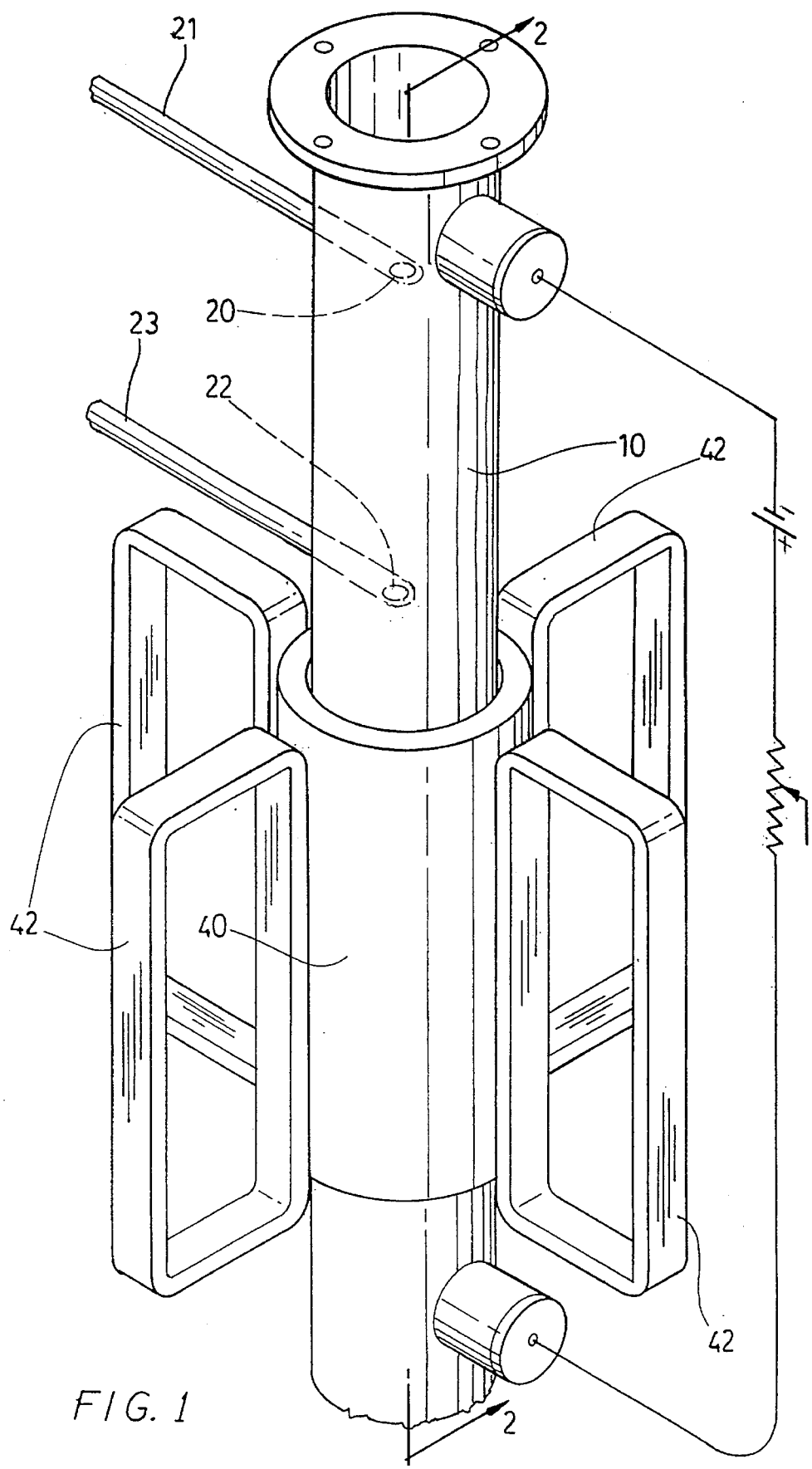
FIG. 1 is a perspective view of a preferred embodiment of the apparatus of the present invention.

Referring to FIG. 1, a first preferred embodiment of the apparatus of the present invention comprises an air-tight tube 10 provided with means for reducing the pressure within the tube 10 such as a conventional vacuum pump (not shown). The tube 10 is preferably formed from a dielectric material, such as alumina, and in operation may be oriented vertically. A dielectric liner 11 is hermetically sealed within the tube 10, leaving a space for a coolant such as water.

Figure 2:
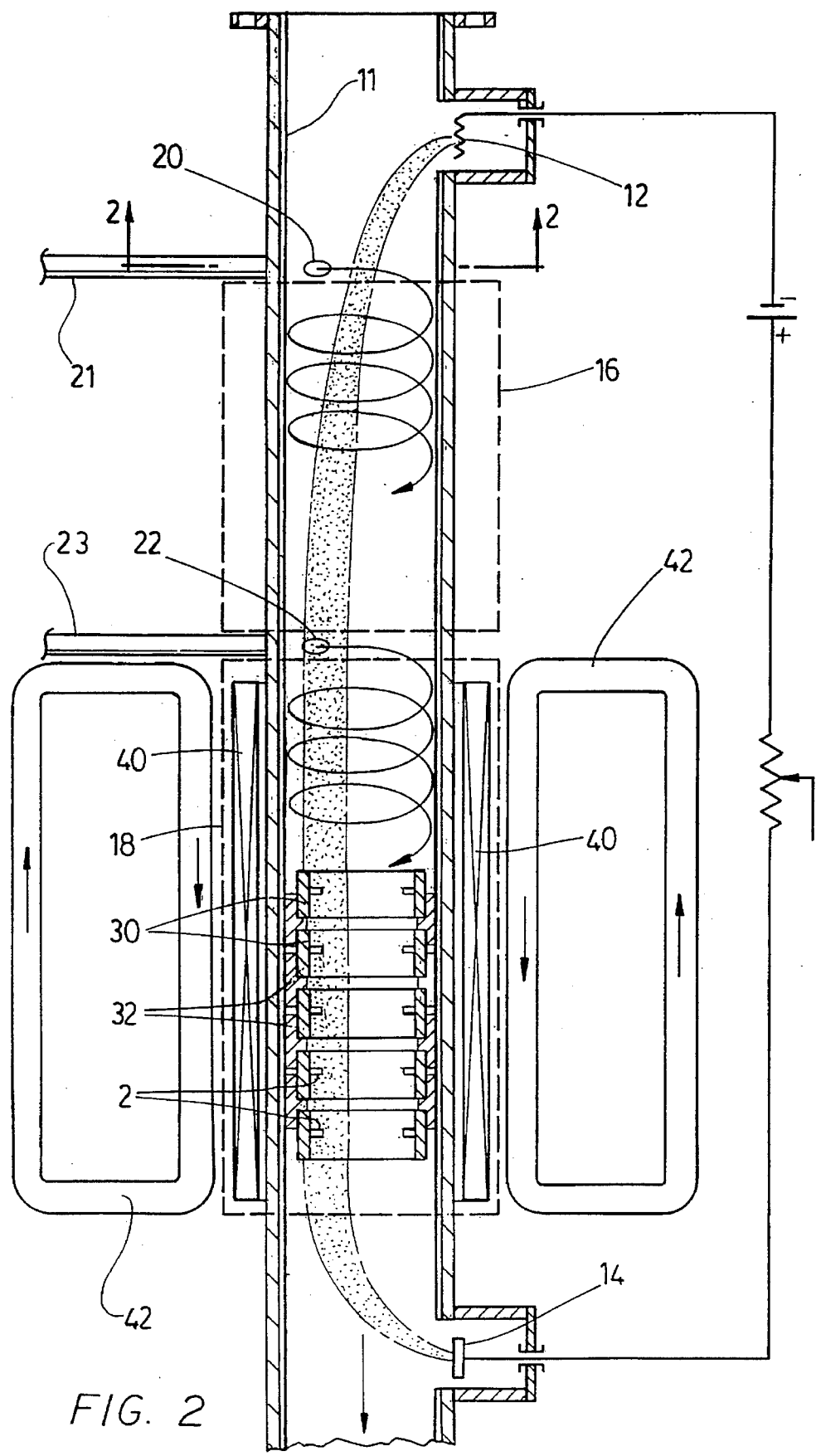
FIG. 2 is a longitudinal cross-section of the apparatus of FIG. 1.

As seen in FIG. 2, the apparatus further comprises a cathode 12 and an anode 14 disposed at upstream and downstream ends of the tube 10, respectively; a stabilizing zone 16 located downstream of the cathode 12; and a cylindrical reaction zone 18 in which the substrates 2 are mounted, located downstream of the stabilizing zone 16.

An inlet tube 21 is in communication with a first inlet 20 for injection of the carrier gas, for example argon, and a plasma-creating gas such as hydrogen, located immediately downstream of the cathode 12. The stabilizing zone 16 consists of the region of the tube 10 between the first inlet 20 and a second inlet 22 downstream thereof fed by a second inlet tube 23, for injection of the reaction species, which in the case of diamond deposition may be methane. It will be appreciated that the carrier, plasma-creating and reaction gases referred to herein are mentioned by way of example only, and the invention is in no way limited to these particular examples.

The stabilizing zone 16 serves a number of purposes: it allows a rotating plasma column to form before the reaction species is introduced; it protects the cathode 12 from deterioration by species dissociation products; and it allows for solid particles to be extracted from the plasma upstream of the reaction zone 18 (i.e. before deposition). The length of the stabilizing zone 16 should thus be at least equal to the diameter of the tube 10, but to be economically viable the length should not exceed 10 tube diameters.

Figure 3:
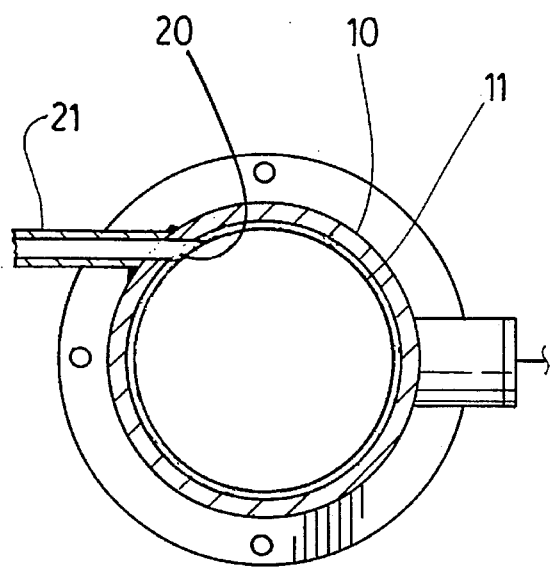
FIG. 3 is a transverse cross-section of the apparatus of FIG. 1.

Rotation of the gases within the tube 10 helps to stabilize the plasma column and render the plasma more homogeneous in the reaction zone 18. Thus, the inlets 20,22 are preferably configured to inject gas into the tube 10 generally tangentially, as illustrated in FIG. 3, which results in a rotating mass of gas within the tube 10 (shown by the helical arrow in FIG. 2). Means for reducing pressure (not shown) draws gases from the tube 10 downstream of the reaction zone 18.

The reaction zone 18 consists of the region of the tube 10 between the second inlet 22 and the anode 14. The reaction zone 18 is cylindrical, for reasons which will be described below. The reaction zone 18 may be formed within annular substrate holders 30 arranged along the inner wall of the tube 10, as in the embodiments of FIGS. 2–5, or substrate holders 50 may be suspended along the axis of the tube 10, as in the embodiment of FIG. 6, in which case the reaction zone 18 will be annular, defined between the walls of the substrate holders 50 and the water-cooled inner wall of the tube 10.

Preferably the diameter of the reaction zone 18 is in the range of 10 mm to 100 mm; less than 10 mm is not efficient from a productivity standpoint, and greater than 100 mm can result in instability of the arc. The current required to sustain the deposition reaction increases with the diameter of the reaction zone 18.

Figure 8:
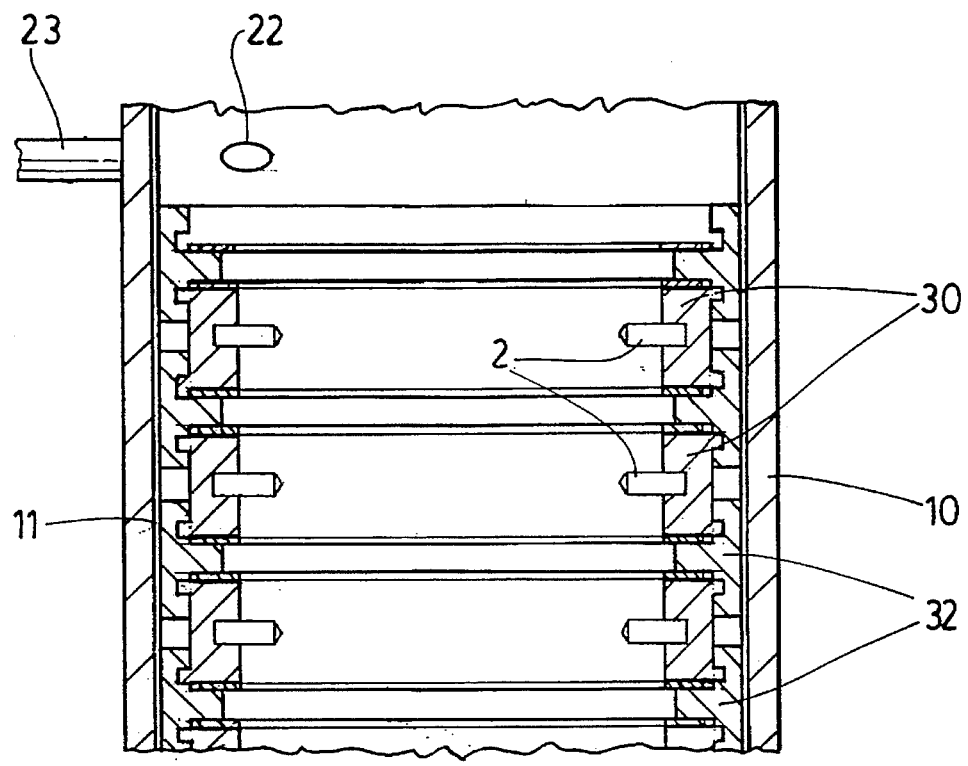
FIG. 8 is a cross-section of the substrate holders in the embodiment of FIG. 2.

In the embodiments of FIGS. 2–5 the substrate holders 30 are preferably electrically conductive annular rings, seen in detail in FIG. 8. A dielectric spacer 32 separates adjacent substrate holders 30, to prevent short circuiting of the electric arc. In this embodiment the substrate holders 30 are stationary within the tube 10, and the dielectric spacers 32 may be affixed to the inner wall of the tube 10 to retain the substrate holders 30. The series of substrate holders 30 thereby forms a "hot liner" which protects the wall of the tube 10 in the vicinity of the reaction zone 18 and confines the arc in the cylindrical plasma channel created within the substrate holders 30.

In this embodiment the substrate holders 30 may be formed from a dielectric material, but it is preferred that the substrate holders 30 be electrically conductive, and be separated by dielectric spacers 32 as shown. This allows a bias potential to be applied to the substrate holders 30, which enhances the deposition process as described below. In either case, however, the axial length of the substrate holders 30 must be selected carefully.

If the substrate 2 is electrically conductive, or if the substrate 2 is dielectric but the coating at any stage of the deposition process is electrically conductive (for example, a very thin film of diamond tends to be conductive due to polarization of the molecules in the film by the ionized plasma), the electric arc can be extinguished in the reaction zone 18 as it permeates the conductive material. In other words, if the voltage drop across the substrate 2 at any time exceeds the voltage drop across the portion of the arc along the length of the substrate 2, the arc will be short-circuited through the substrate 2. To avoid this phenomenon, the substrate holders 30 are designed according to the formula $$E_c \times l_s < V_c + V_a + I_c \times \rho_s \times l_s$$

where $E_c$ is the charge of the electric field created in the arc column,
$l_s$ is the axial length of the substrate holder 30,
$V_c$ is the voltage of the cathode,
$V_a$ is the voltage of the anode,
$I_c$ is the current in the arc column, and
$\rho_s$ is the specific resistivity of the substrates along the arc axis.

In the case of electrically conductive substrates the specific resistivity $\rho_s$ of the substrate is very small, so that the voltage drop across the substrate (represented by $I_c \times \rho_s \times l_s$) is very small in comparison to the sum of the cathode and anode voltages. Thus, for a conductive substrate this formula can for practical purposes be written as $$E_c \times l_s < V_c + V_a$$

This formula can also be expressed in terms of the critical length $l_c$ of the substrate holder 30, which is equal to the sum of the cathode and anode voltages (plus the voltage drop of the substrate 2 if the arc current is short-circuited by a substrate) divided by the charge of the electric field in the reaction zone, or $$l_c = \frac{V_c + V_a}{E_c}$$

At and beyond this critical length $l_c$ the arc would be short-circuited through the substrate holder 30 and would burn the substrate 2. The provision of dielectric spacers 32 between adjacent substrate holders 30 ensures that adjacent substrates 2 do not combine to exceed the critical length $l_c$.

The substrate holders 30 protect the inner wall of the tube 10 from species dissociation products, and as such it is advantageous to align the substrate holders 30 and the dielectric spacers 32 immediately adjacent to one another (i.e. without gaps between substrate holders 30). As noted above, the substrate holders 30 in these embodiments effectively form a "hot liner", and the arc is confined within the cylindrical plasma channel created through the abutting substrate holders 30. A variation of the substrate holders 30, illustrated in FIG. 18, converts the series of substrate holders 30 into a "cool liner" by providing a coolant channel 81 within each substrate holder 30.

The substrate holders 30 are deliberately provided with sharp edges, which makes deposition difficult and the substrate holders 30 thereby tend to resist coating to some degree during the deposition process. Where multiple substrates 2 are being coated, it is advantageous to position all substrates 2 the same distance from the wall of the tube 10, to ensure a consistent coating over all substrates.

In the embodiments of FIGS. 2–5, magnetic fields are employed to guide the plasma column within the reaction zone 18. A longitudinal magnetic coil 40 disposed uniformly about the tube 10 in the region of the reaction zone 18 creates a longitudinal magnetic field which increases plasma activity and focuses the plasma column into a relatively narrow stream. A plurality of transverse magnetic coils 42 are positioned uniformly around the tube 10 along the reaction zone 18 to create a transverse magnetic field which controls the radial positioning of the plasma column within the reaction zone 18 and thus directs the plasma toward the substrates 2. An electric current is applied through all of the transverse coils 42 in the same direction, as indicated by the arrows in FIG. 2.

In operation, the substrates 2 to be coated, drill bits in the embodiments shown, are mounted through openings in the substrate holders 30 as best seen in FIG. 8. A high-current, low voltage DC power source 8 is activated to create a voltage between the cathode 12 and the anode 14, and the carrier and plasma-creating gases are injected into the first inlet 20. An arc forms between the cathode 12 and the anode 14, which ionizes the rotating plasma gas.

The reaction species is then injected into the tube through the second inlet 22, and dissociation occurs as the species encounters the rotating plasma. At this stage the plasma is just entering the reaction zone 18, and the longitudinal magnetic coil 40 has concentrated the plasma into a tight column.

The pressure within the tube may be maintained between 10 Torr and 1000 Torr. A pressure greater than 1000 Torr will result in an unstable arc, whereas a pressure less than 10 Torr is uneconomical in an apparatus of this configuration.

In the embodiments in which the substrate holders 30 are arranged around the periphery of the reaction zone 18, as shown in FIGS. 2–5, the transverse magnetic coils 42 are activated to establish a transverse magnetic field biased toward the wall of the tube 10, thereby directing the plasma column into contact with the substrates 2. This embodiment provides the additional advantage that substrates 2 need not be located only along one portion of the reaction zone 18, as in a conventional arc coating apparatus where the substrates are all located on a single planar surface (e.g. the floor). The substrates 2 may be positioned anywhere around the inner wall of the series of substrate holders 30, i.e. the cylindrical plasma channel, which in these embodiments defines the periphery of the reaction zone 18. The transverse magnetic field created by the transverse magnetic coils 42 can be cycled or rotated around the reaction zone 18 by varying the intensity of the magnetic field generated by each coil 42 with time, causing the plasma column to periodically circle the inner wall of the series of substrate holders 30 over a selected period. Alternatively, the transverse magnetic field can be kept stable, maintaining the plasma column stationary along any desired portion of the reaction zone 18, and the tube 10 itself can be rotated so that the substrates 2 each, in turn, pass through the plasma and are thereby coated. In either case, this significantly increases the available deposition area by many times beyond that in the reaction zone of a conventional arc coating apparatus.

Figure 9:
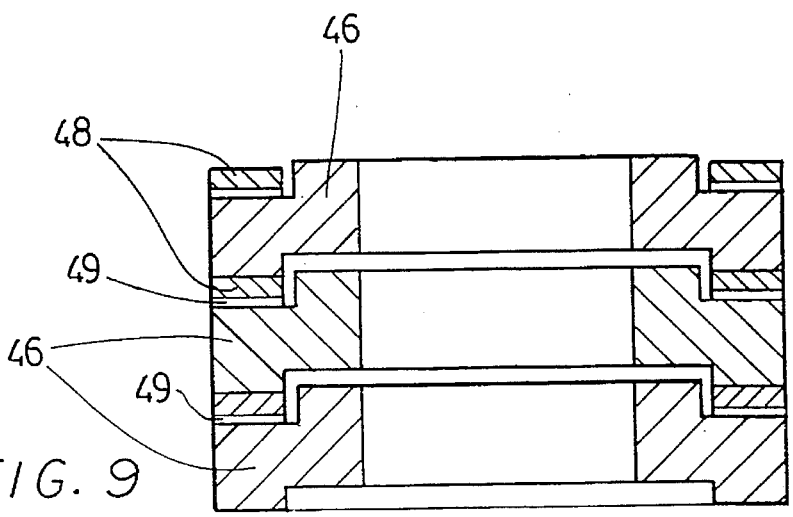
FIG. 9 is a cross-section of a variation of the substrate holders illustrated in FIG. 8.

An alternative configuration for the substrate holders for the embodiments of FIGS. 2 to 5 is illustrated in FIG. 9, which shows a series of electrically conductive substrate holders 46 separated by dielectric spacers 48. In this embodiment, small gaps 49 are provided to help species dissociation products to escape from the column of substrate holders 48 during the deposition process. Dissociation products are drawn out through the downstream end of the tube 10 by the vacuum pump.

Figure 6:
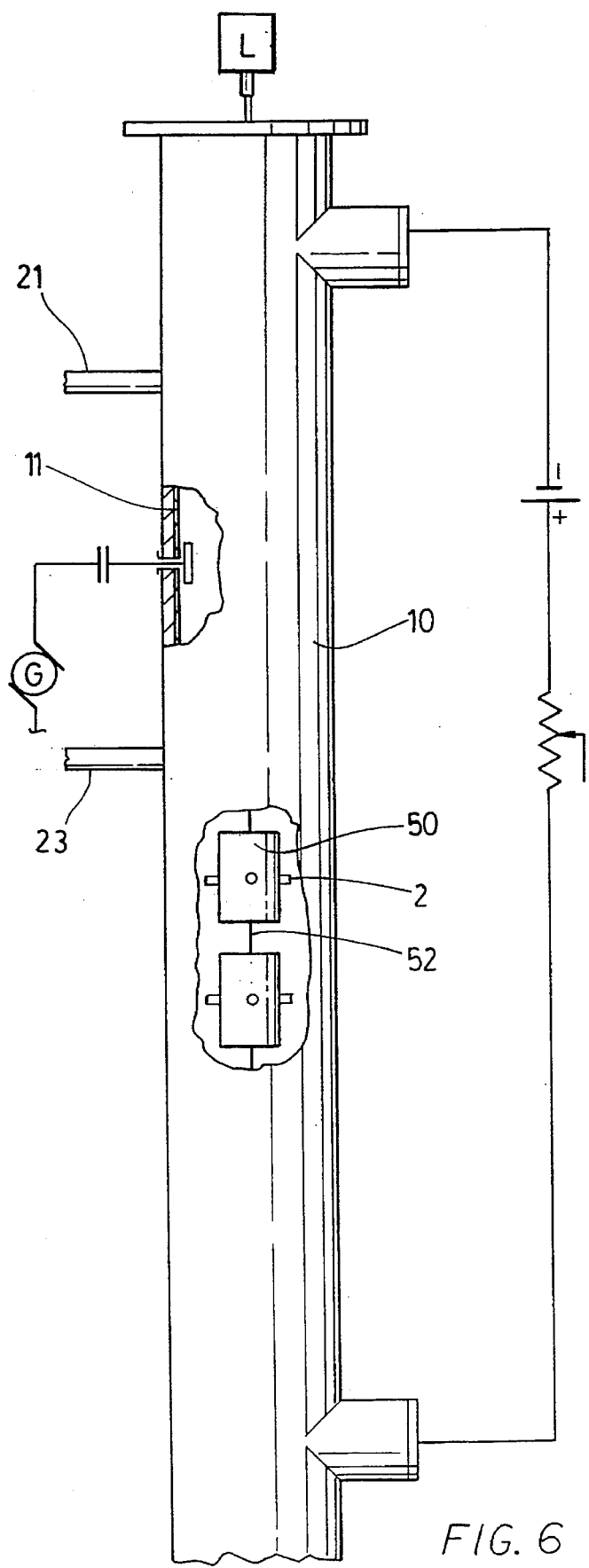
FIG. 6 is a partially cut-away view of a still further embodiment of the present invention.
Figure 7:
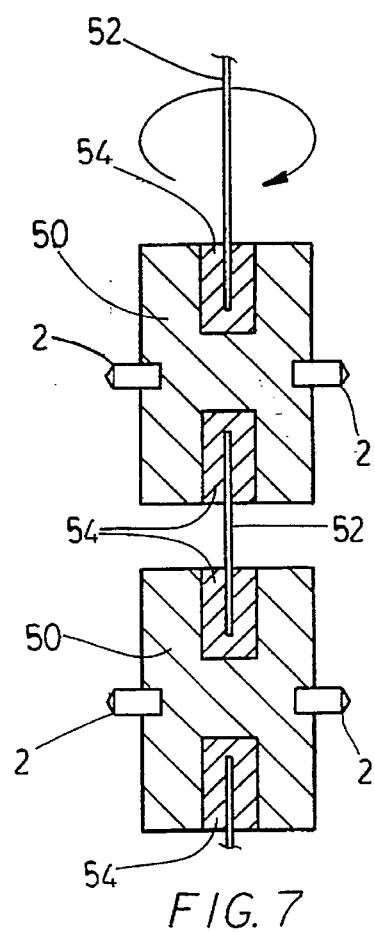
FIG. 7 is a cross-section of the substrate holders in the embodiment of FIG. 6.

In a further embodiment of the invention, illustrated in FIG. 6, electrically conductive substrate holders 50 are suspended along the axis of the reaction zone 18 by a dielectric filament 52. Each substrate holder 50, shown in FIG. 7, is a solid block of conductive material provided with side openings into which the substrates 2 are mounted, and end openings filled with a dielectric material 54 such as alumina into which the dielectric filaments 52 are embedded. The substrate holders 50 have an axial length less than the critical length $l_c$ referred to above, and it is essential that the filaments 52 joining the substrate holders 50 be dielectric so that the substrate holders 50 in the chain do not combine to exceed the critical length. The topmost filament 52 is connected to rotating means such as a conventional electric motor, which rotates the chain of substrate holders 50 during the deposition process.

In this embodiment the transverse magnetic coils 42 are used to establish a transverse magnetic field about the reaction zone 18 which keeps the plasma column generally centred between the wall of the tube 10 and the substrate holders 50. The substrates 2 are thereby coated as the plasma column flows through the reaction zone 18, i.e. the plasma channel defined between the inner wall of the tube 10 and the outer walls of the substrate holders 50, and rotating the substrate holders 50 ensures a thorough, uniform coating or film over the substrates 2. The water-cooled inner wall of the tube 10 in this embodiment acts as a "cool liner" while the chain of substrate holders 50 acts as a "hot liner", and the plasma column is confined therebetween.

This embodiment of the invention may be particularly suitable for use in a microgravity environment, for example for coating articles in outer space. The substrate holders 50 and filaments 52 would be unnecessary, as the substrates 2 could be permitted to float freely within the reaction zone 18. A uniform coating will result providing that the plasma column occupies substantially the entire diameter of the reaction zone 18.

Figure 10:
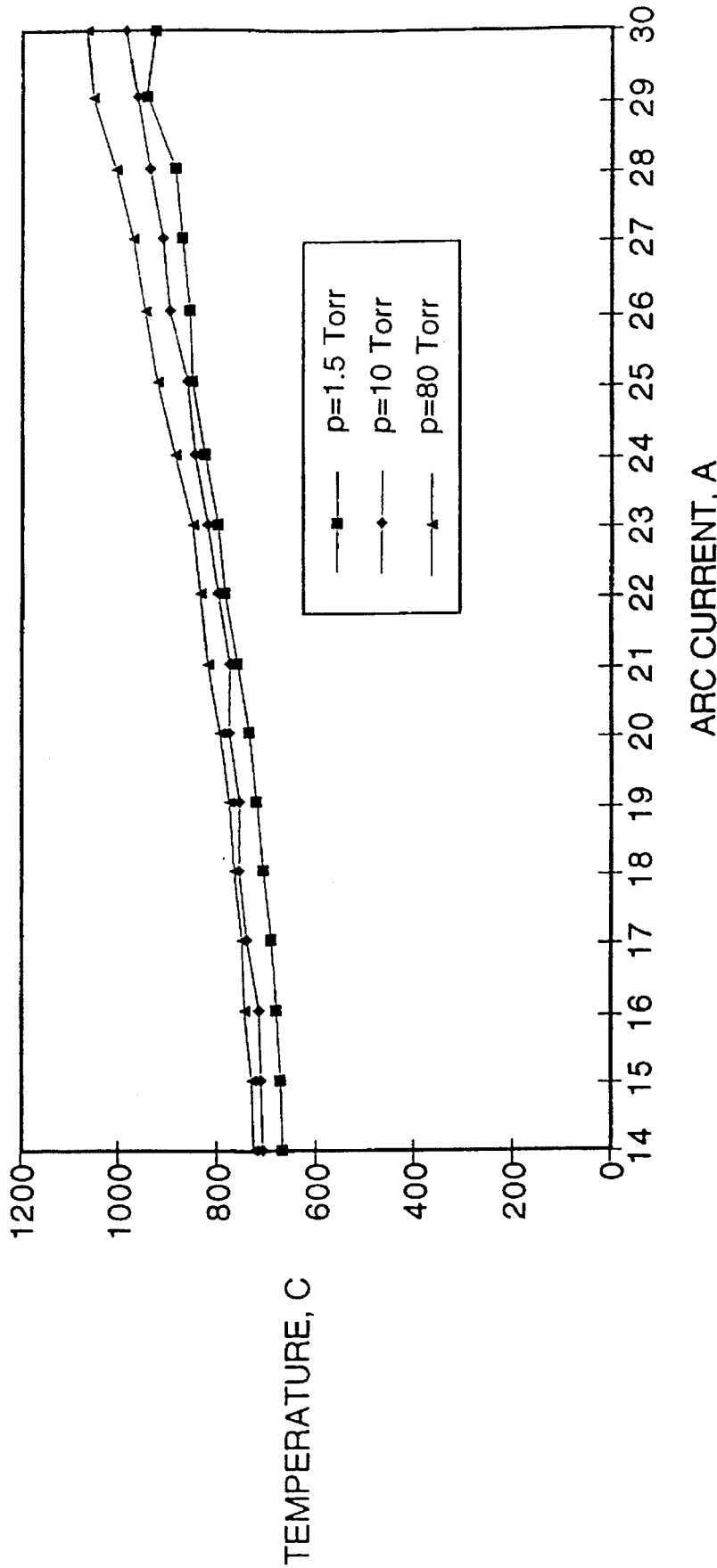
FIG. 10 is a graph showing the relationship between arc current and substrate temperature with other parameters maintained constant.

As is known, the temperature of synthesis determines both the deposition rate and the quality of the coating. In the case of certain coatings, such as diamond, the configuration of the coating (e.g. crystalline or planar) is also determined by the temperature of synthesis. The temperature of synthesis is determined by the "specific power" per unit volume of arc $P_A$ in W/cm³, which is governed by the formula $$P_A = I_A \times E_A / A_{channel}$$

where $I_A$ is the arc current and $E_A$ is the electrical charge of the arc, which is a function of the gas composition and pressure within the tube 10, and $A_{channel}$ is the cross-sectional area of the arc-confining channel in the reaction zone 18. Thus, the temperature of synthesis may be regulated by changing the arc current, keeping the plasma density and pressure constant, or by changing the plasma density and/or pressure. FIG. 10 illustrates the relationship between the arc current and the substrate temperature, assuming all other factors remain constant.

Preferably for depositing diamond the carrier gas will be argon or another inert gas, and the reaction species will include hydrogen plus a chemical species including carbon, such as $C_nH_m$, $C_nH_mO_p$, etc. For creating a cubic boron nitride film, the reaction species will include hydrogen plus a chemical species including boron, such as $B_nH_m$, and $N_2$. The pressure within the tube 10 is reduced to the range of 10–1000 Torr, and the specific power of the electric arc should be in the range between 0.1 W/cm³ and 50 W/cm³. If the arc power is below this range the chemical species will not decompose and the substrate temperature will be too low to allow satisfactory bonding between the film and the substrate. If the arc power is above this range, the substrates will overheat and burn.

The deposition process can be enhanced by utilizing a separate source of power, in a number of ways.

Figure 4:
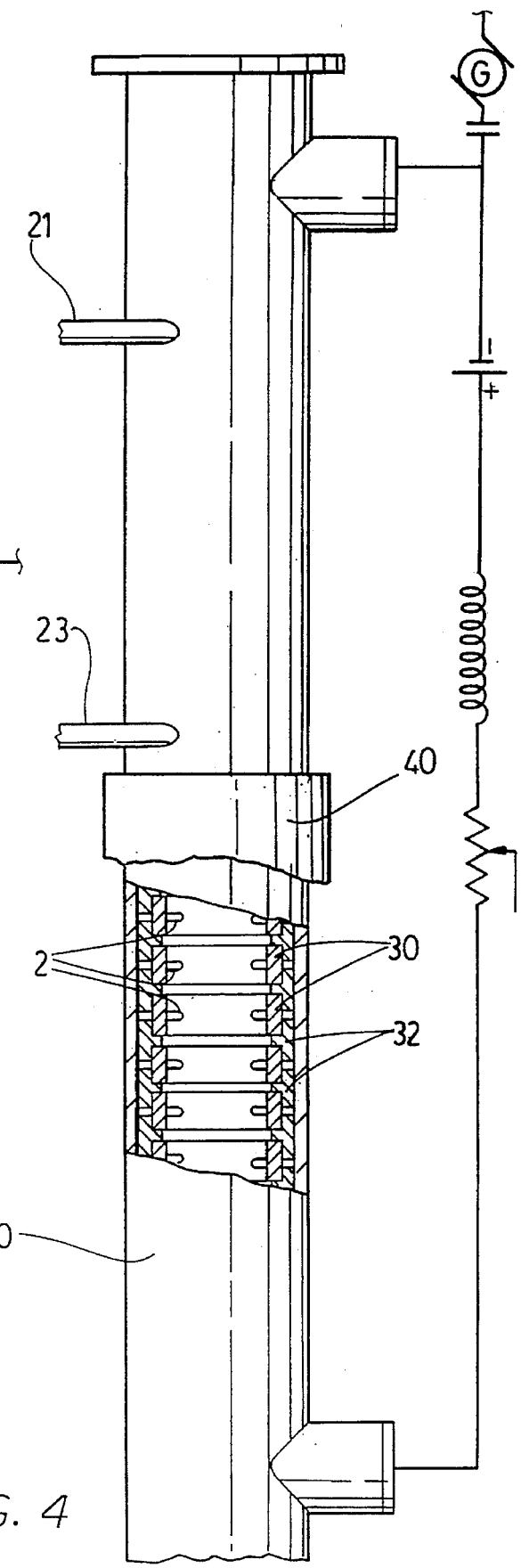
FIG. 4 is a partially cut-away view of a further embodiment of the present invention.

One manner of enhancing deposition is by injecting into the plasma an oscillating electromagnetic signal in the range of 10 Hz to 1 GHz, using a suitable RF or LF generator G, from either the upstream end or the downstream end of the tube 10, or both. This embodiment is illustrated in FIGS. 4 and 6. Local concentrations of electrons in the vicinity of the substrate 2 tend to cause a voltage drop in the deposited film, which inhibits further deposition and can destroy the film. The injected oscillating electromagnetic field heats the plasma and disperses local concentrations of electrons, thus reducing this effect. Alternatively, the longitudinal magnetic field established in the reaction zone 18 by the magnetic coil 40 can be made to oscillate, which will reduce local concentrations of electrons with the same results.

Figure 5:
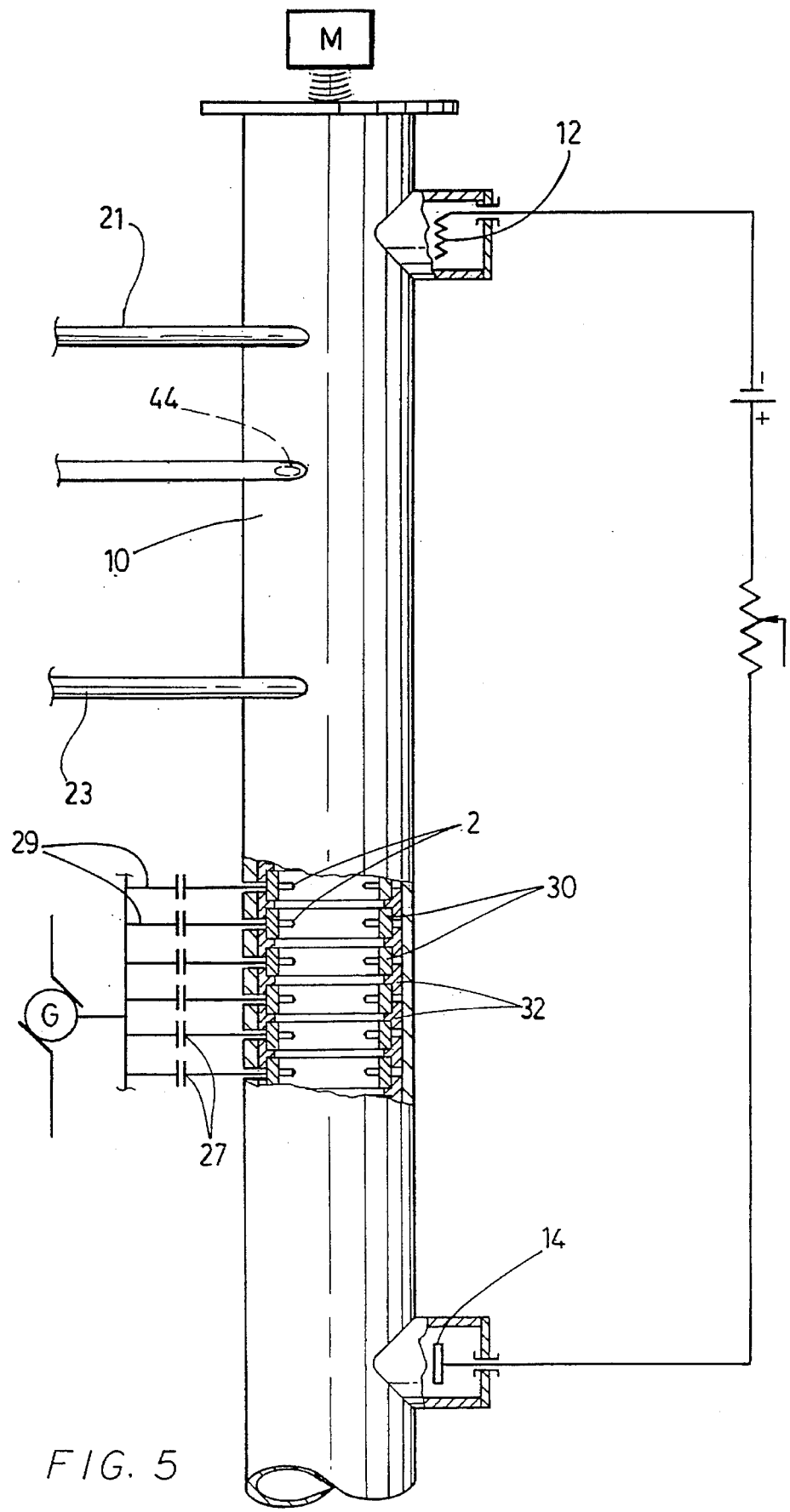
FIG. 5 is a partially cut-away view of a still further embodiment of the present invention.

The deposition process can be enhanced by applying a bias voltage to the substrates 2, by connecting an AC or DC generator G to the substrate holders 30 through conductors 29 passing through the wall of the tube 10, as shown in FIG. 5. Diamond, for example, has a low deposition rate but a very low etching rate. Graphite, on the other hand, has a high deposition rate but a very high etching rate. Diamond film deposition occurs effectively where the etching rate of graphite is greater than its deposition rate and the deposition rate of diamond is greater than its etching rate. The etching rate of graphite is increased by applying a bias voltage to the substrates 2, which attracts ions from the plasma. Either a DC or a low frequency AC voltage can be applied, so long as the bias voltage satisfies the condition $$V_{bs} - V_p < 10 \, V_c$$

where $V_{bs}$ is the bias potential on the substrates, $V_p$ is the plasma potential near the substrates, and $V_c$ is the voltage drop on the cathode.

If the difference between $V_{bs}$ and $V_p$ exceeds $10 V_c$ this will lead to electrical discharge between the surface of the substrate 2 and the arc column.

Figure 20:
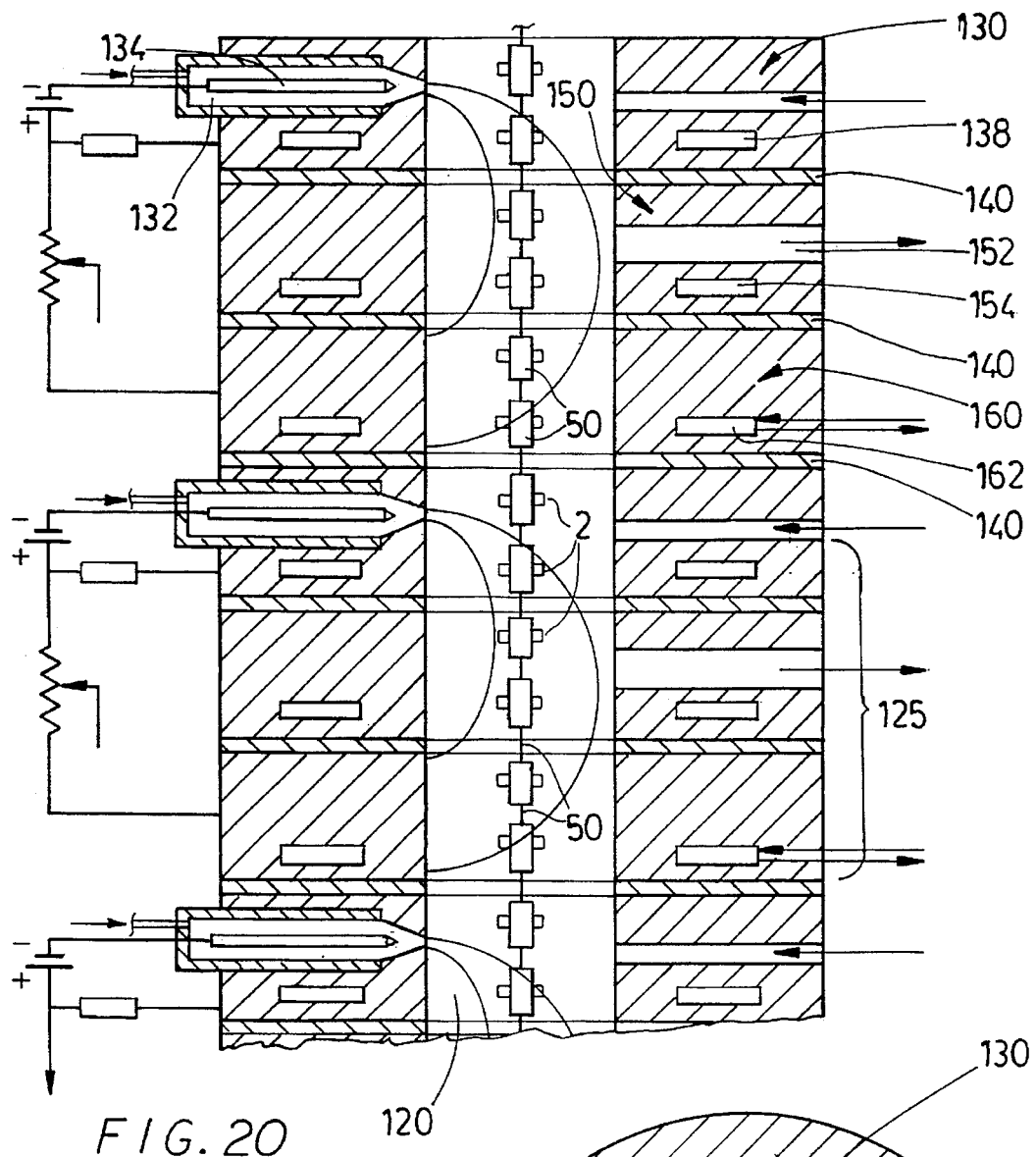
FIG. 20 is a cross-section of a further embodiment of the invention in which multiple cathode/anode pairs are contained within the substrate holders.

Another means of enhancing deposition utilizes a microwave generator M injecting a 1 GHz to 10 GHz signal into either the upstream end or the downstream end of the tube 10, as illustrated in FIG. 5. A further variation of this embodiment is illustrated in FIG. 20, in which the tube 10 is formed from copper with a silver coating, to act as a microwave waveguide. The inner wall of the tube 10 should be provided with a liner of dielectric material, such as boron nitride, to insulate the tube 10 from the charged plasma. The injection of microwave energy in this fashion has an effect similar to that described above with respect to the injection of RF and LF energy. The optimum condition for depositing diamond and related materials, such as cubic boron nitride, in a low pressure range (i.e. less than 1 Torr) requires a longitudinal magnetic field satisfying the electron cyclotron resonance (ECR) condition in the plasma column where the electron gyration frequency is equal to that of the microwave. Thus, for a microwave frequency of 2.45 GHz, a longitudinal magnetic field of 1,000 Gauss is required for a pressure of 0.01 Torr. For pressures ranging between 0.001 and 1 Torr, a longitudinal magnetic field ranging from 100 to 10,000 Gauss is required for a microwave frequency in the range of 100 MHz - 10 GHz.

Figure 19:
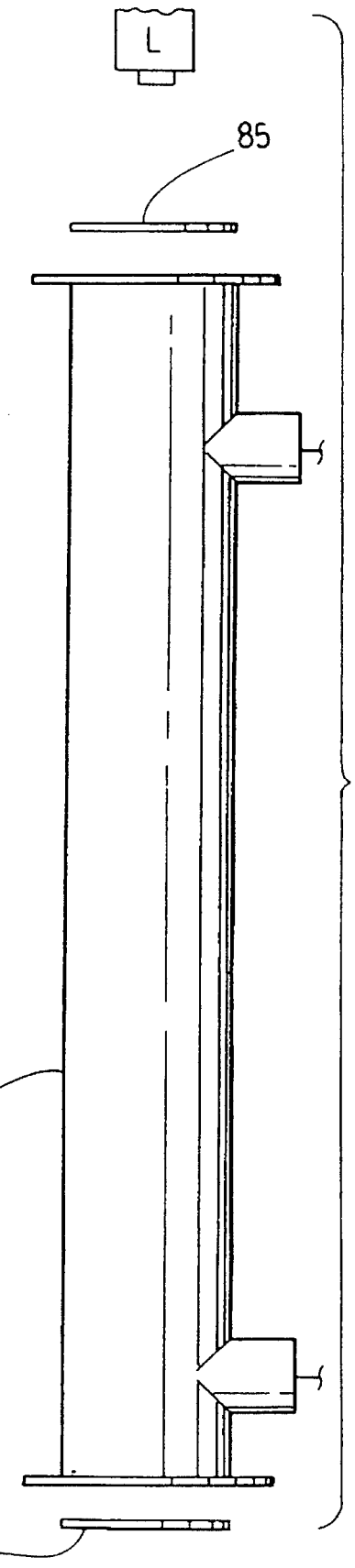
FIG. 19 is an elevation of a laser-assisted linear DC arc CVD reactor embodying the invention illustrating the configuration of a laser resonator.

The deposition process can be enhanced as well by injecting light, preferably from a laser L, into either the upstream end or the downstream end of the tube, as illustrated in FIG. 6. The coherent light generated by the laser activates atoms and molecules through excitation of electron states, rendering them more susceptible to reaction and adding energy to the plasma column. This can be accomplished particularly effectively using a laser resonator, such as that illustrated in FIG. 19. The ends of the tube 10 are transparent, and mirrors 85 are positioned so as to reflect light from the laser L axially along the plasma column. By resonating the laser light in this fashion a low power laser will suffice to achieve the desired enhancement.

Figure 17:
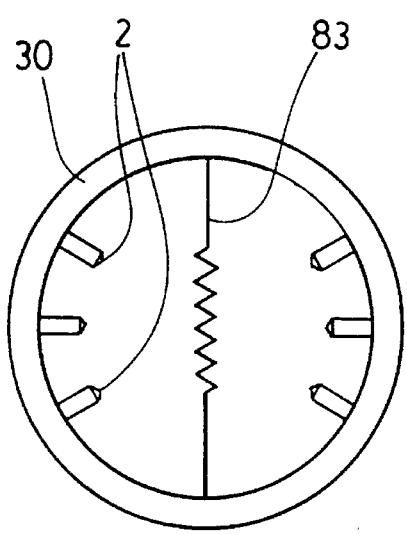
FIG. 17 is a plan view of a further embodiment of substrate holder including a thermionic cathode.

In a further embodiment of the invention, a thermionic filament 83 composed of a refractory material, such as tungsten, is mounted across the interior of each substrate holder, as shown in FIG. 17. The filament 83 can be a cathode, if connected to the power source; an anode, if connected to the ground; or at floating potential, in which situation the filament 83 is neither a cathode nor an anode. The filament 83 becomes hot under the influence of the arc, and thus serves as a surface for catalytic reactions, facilitating creation of the reaction species near the substrate 2 without having to heat the substrate 2 to temperatures which could destroy the deposited coating (for example, a tungsten filament can heat up to around 2300° C. under the influence of the arc). By applying a voltage to heat the filament 83, the hot filament 83 also becomes a source of electrons, which increases the ionization of the plasma in the immediate vicinity of the substrates 2, and thus increases the deposition rate. This embodiment is shown in cross section in FIG. 18, with water cooling channels 81 surrounding the substrate holders 30. This variation is applicable to both the embodiment illustrated in FIG. 5, with annular substrate holders 30, and the embodiment illustrated in FIG. 6, with axial substrate holders 50.

It will be apparent that the apparatus of the present invention is especially suitable for coating a fibre or filament, because of the cylindrical geometry and relatively long length of, and the uniform plasma density in, the reaction zone 18. This provides very uniform conditions for deposition of a coating on a fibre or filament. An embodiment of the invention adapted for coating a filament is illustrated in FIG. 13.

Figure 13:
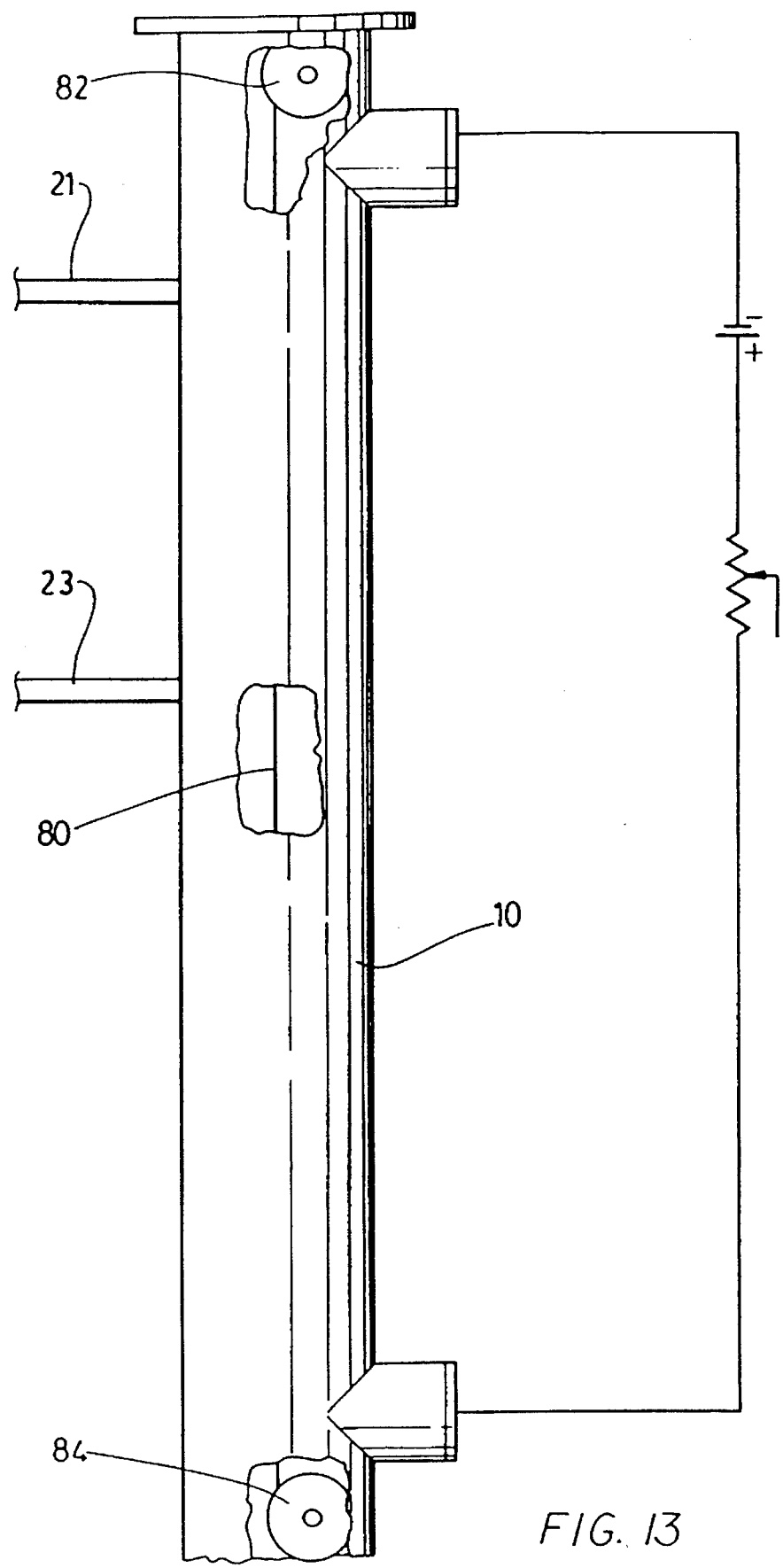
FIG. 13 is a cross sectional partial elevation of an embodiment of the invention adapted for deposition on a filament.

As illustrated in FIG. 13, a dielectric filament 80 is wound around a spool 82 positioned within the tube 10 upstream of the cathode 12. A motor-driven take-up spool 84 is positioned within the tube 10 downstream of the anode 14. Both spools 82,84 are arranged so that the filament 80 is pulled through the axial centre of the reaction zone 18. This embodiment is otherwise configured as in the embodiment of FIG. 6, with the liner 11 extending along the length of the tube 10 between the cathode 12 and the anode 14.

The length of the filament 80 is the same as the length of the arc, and is thus necessarily longer than the critical length $l_c$, discussed above. A conductive filament therefore cannot be used in the deposition process of the invention. However, the formula expressed above $$E_c \times l_s < V_c + V_a + I_c \times \rho_s \times l_s$$

still applies where a thick coating is applied to the filament 80, because the specific resistivity of the filament 80 increases in direct proportion to the thickness of the coating. To ensure that the filament 80 is not burned by short-circuiting of the arc through the filament 80, the voltage drop across the filament 80 must always be less than the voltage drop across the arc. The coated portion of the filament 80 must therefore be removed from the reaction zone 18 before the specific resistivity of the filament plus coating exceeds the specific resistivity of the plasma. The rate at which the filament 80 is drawn through the reaction zone, which determines the thickness of the deposited coating, must take this into account.

Figure 21:
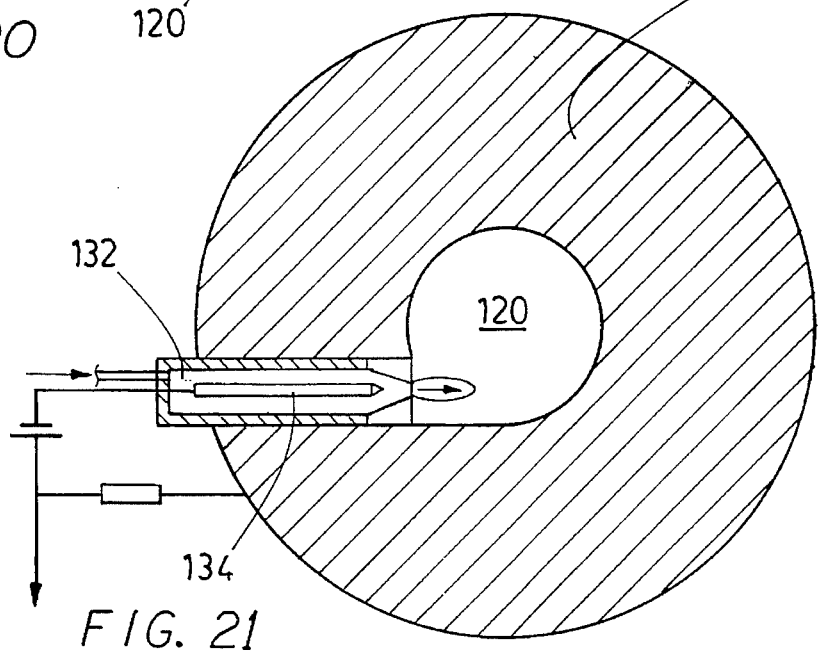
FIG. 21 is a top plan view of the embodiment illustrated in FIG. 20.

In a further embodiment of the invention illustrated in FIGS. 20 and 21, a self-contained reaction section 125 is formed from a series of three annular disks 130, 150 and 160, aligned to create a cylindrical plasma channel 120 running therethrough. Disk 130 is provided with a chamber 132 which contains a cathode 134 preferably comprising a Tungsten rod. An inlet 136 for the injection of the carrier gas, plasma creating gas and reaction species is provided opposite the cathode 134. A channel 138 allows water to circulate around the disk 130, to cool the disk 130 during the coating process. A second annular disk 150, spaced from the disk 130 by an annular insulating spacer 140, is provided with an outlet 152 connected to the means for reducing pressure within the channel 120. The disk 150 is provided with a channel 154 for the circulation of a coolant such as water, to cool the disk 150 during the coating process. Separated from the disk 150 by an annular spacer 140 is a third disk 160 which contains a coolant channel 162 for circulating a coolant, to cool the disk 160 during the coating process. The disk 160 acts as an anode.

Successive series of self-contained reaction sections 125 comprising disks 130, 150 and 160 are illustrated in FIG. 20. A series of substrate holders 50 are suspended in the plasma channel 120 by dielectric fibres 52, as in the embodiment of FIG. 6. Any number of such self-contained reaction sections 125 may be adjoined, separated by annular spacers 140, and each section constitutes a linear CVD arc coating apparatus. This embodiment, utilizing self-contained reaction sections 125, can also utilize the disks 130, 150 and 160 as substrate holders instead of the axial substrate holders 50 illustrated in FIG. 20.

In operation, a potential difference between the cathode 134 and the anode disk 160 causes an arc to burn in the tubular channel 120. The carrier gas, plasma creating gas and reaction species are injected into the inlet 136, and the coating process occurs as in the previous embodiments. This configuration provides the advantage that the length of the reaction zone (and thus the length of the plasma channel 120) can be varied to suit the number of substrates 2 to be coated, while a uniform coating is obtained as between reaction sections 125 because the length of the arc (i.e. the distance from the cathode 134 to the anode disk 160) is similar in each case.

Figure 22:
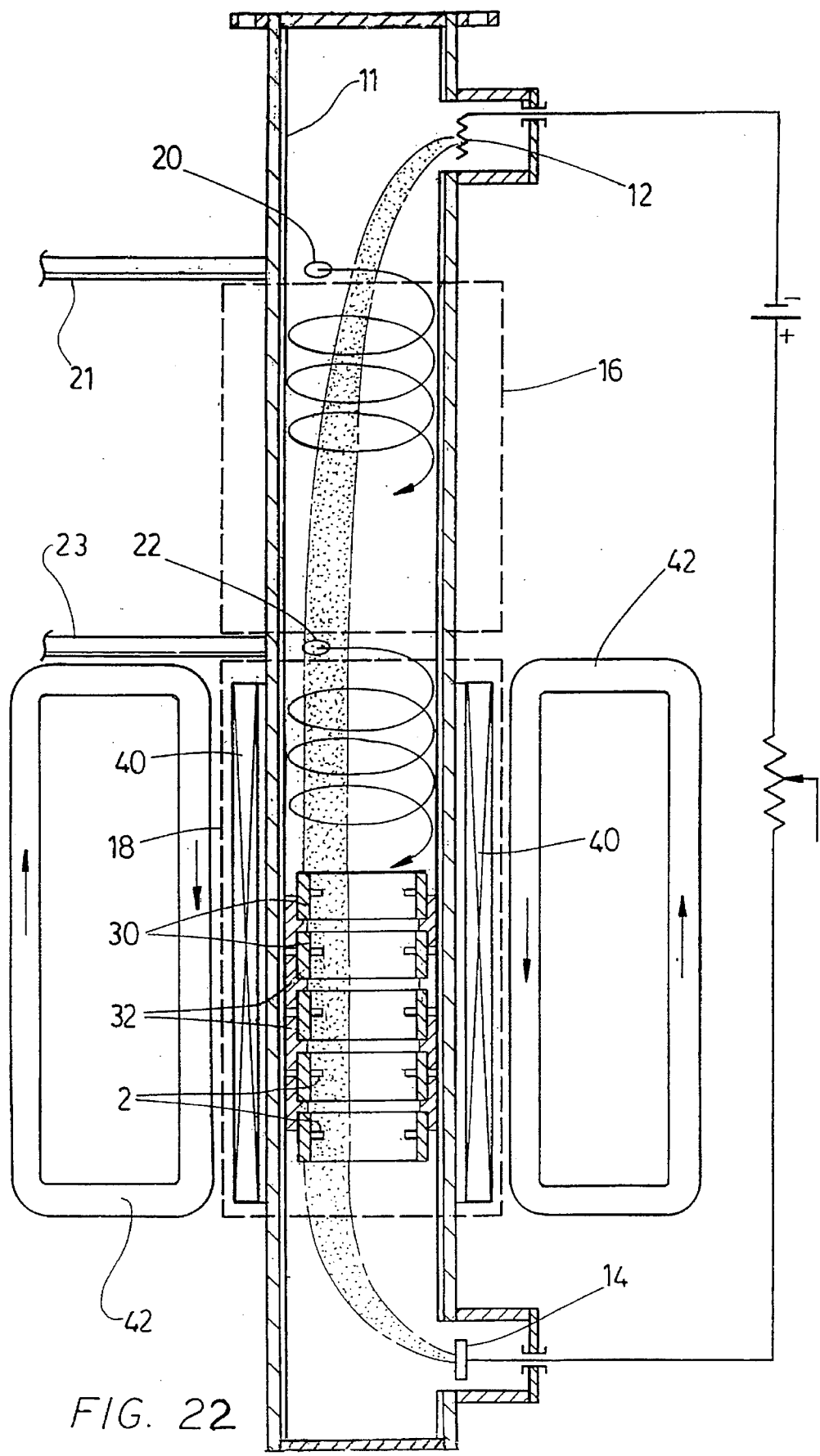
FIG. 22 is a cross section of a further embodiment of the invention in which the reaction tube is sealed during the arc coating process.

Because the apparatus of the invention allows the deposition process to take place under relatively high pressures, between 10 and 1000 Torr, it is possible to use the invention at atmospheric pressure, without the need for means for reducing pressure in the reaction zone. FIG. 22 illustrates such an embodiment, which is essentially identical to the embodiment illustrated in FIGS. 1–4 except that the ends of the tube 10 are sealed. In this embodiment the plasma-creating gas, for example hydrogen, is merely a transport agent for the coating material, for example graphite particles, in a "transport chemical reaction". Carbon atoms, which may be produced by a hot cathode composed of graphite or carbon inserts distributed homogeneously within the tube, form weak chemical bonds (CH radicals) with the hydrogen, and are carried to the substrate 2 by natural movement of the gas within the tube. Rotation of the tube wall improves the deposition rate.

The source of the reaction species gas may be provided inside the sealed reaction tube in this embodiment. For example, graphite particles or tablets for the emission of carbon atoms can be situated inside the tube, preferably outside of the reaction zone 18, which act as an absorber or an emitter of the reaction species. Thus, so called "getters", which are hybrids of metals such as titanium alloys (e.g. TiFe, TiZr) that when heated to an absorption temperature of about 200° C. attract and absorb hydrogen atoms, and when heated to a higher emission temperature such as 500° C. emit hydrogen atoms, can be used as a source of gas for the deposition process. $H_2$ saturated tablets can be heated by the arc in the reaction zone, or by a separate heating source outside of the reaction zone, and will emit hydrogen atoms during the heating process. In fact, positioning such "getters" at one (inlet) end of the reaction zone 18 and heating these to the emission temperature, and positioning a non-sputtering getter such as TiZr, ZrAl or the like at the other (outlet) end of the reaction zone 18 and heating them to the absorption temperature, will result in a flow of hydrogen gas through the reaction zone 18, without any actual injection or removal of gas from the tube. With this configuration $H_2$ gas and the reaction gases (for example $C_mH_n$, $C_mH_nO_p$, etc.) will flow through the reaction zone 18.

This embodiment is also particularly well suited for use in microgravity conditions, and for use with a powdered reaction species such as graphite particles. The graphite particles will float freely and distribute evenly throughout the reaction zone. The substrates 2 similarly float freely throughout the plasma, and the coating process occurs through the transport chemical reaction as the substrate encounters CH radicals and displaces the carbon atoms therefrom. In this condition, the wall of the tube 10 acts as a substrate holder, confining the free-floating substrates within the plasma contained in the tube 10.

EXAMPLE 1

In this example the apparatus shown in FIG. 1 was used. Cemented carbide inserts WC-6%Co 10×10×3 mm as substrates 2 were positioned on silicon fibre substrate holders 30 along the axis of the tube 10 in the reaction zone 18. The tube 10 was sealed and inside pressure reduced to $10^{-4}$ Torr. The method of the invention was carried out as follows:

1. The substrate holders 30 were rotated;
2. Ar as a carrier gas and $H_2$ as plasma-creating gas were injected into the first inlet 20 with sufficient flow rate to increase the pressure in the tube 10 to between $1 \times 10^{-2}$ and $1.2 \times 10^{-2}$ Torr;
3. A DC arc was ignited between the cathode 12 and the anode 14;
4. Magnetic coils 40 and 42 were activated, creating a longitudinal magnetic field and a rotating transverse magnetic field, respectively;
5. The flow rate of carrier gas was increased to 2 slm and flow rate of plasma-creating gas was increased to 200 sccm, increasing pressure in the tube 10 to 30 Torr;
6. The arc current was adjusted to increase the temperature of the substrates to the range of 1000°–1050° C.;
7. These parameters were maintained for 30 minutes for cleaning and uncarburisation of the carbide surfaces;
8. $CH_4$ was injected as a reaction species through the second inlet 22 with a flow rate of 4 sccm;
9. The arc current was adjusted to decrease the temperature of the substrates to the range of 930°–970° C.;
10. These parameters were maintained and the substrates were processed for 600 minutes for deposition of a 10 μm diamond film over the substrates;
11. Injection of the reaction species was discontinued;
12. Rotation of the magnetic field was halted;
13. The DC arc was extinguished and the magnetic fields were deactivated;
14. Injection of the carrier and plasma-creating gases was discontinued; and
15. The apparatus was opened and discharged.

Figure 11:
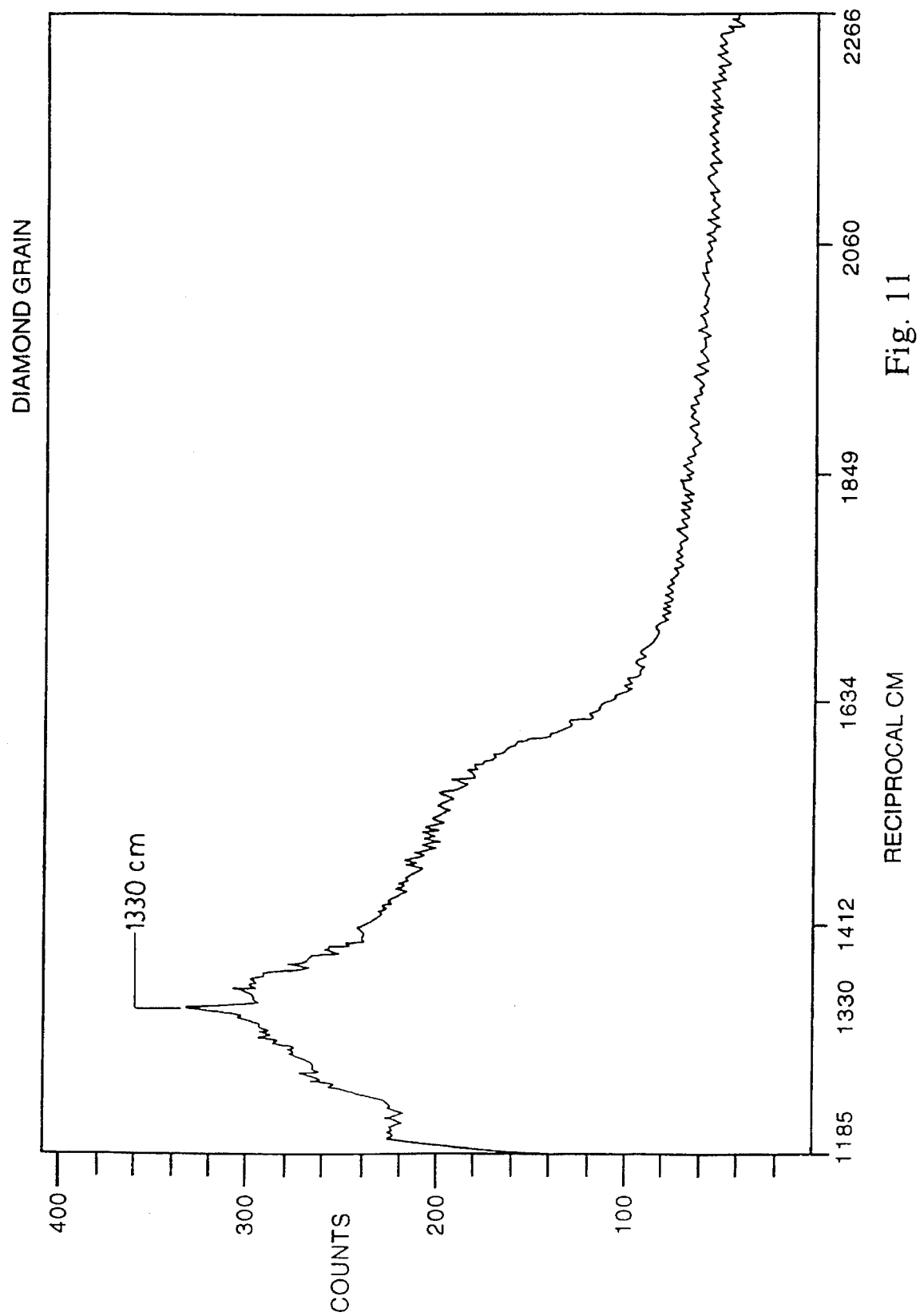
FIG. 11 is an overlay of Raman spectra of the deposit of diamond grainss produced by the process of Example 1.

The Raman spectra of the 10 μm diamond films produced is illustrated in FIG. 11, showing a sharp peak at a wavelength of 1330 cm$^{-1}$ corresponding to the diamond phase. The results obtained are shown below in Table 1.

EXAMPLE 2

In a second example, the apparatus illustrated in FIG. 4 was used. Cemented carbide drills WC-6%Co dimension 20×1 mm as substrates 2 were positioned along the wall of the tube 10 on the steel ring substrate holders 30, separated by alumina rings 32. The tube 10 was sealed and inside pressure reduced to $10^{-4}$ Torr. The method of the invention was carried out as follows:

1. Ar as a carrier gas and $H_2$ as plasma-creating gas were injected into the first inlet 20 with sufficient flow rate to increase the pressure in the tube 10 to between $1 \times 10^{-2}$ and $1.2 \times 10^{-2}$ Torr;
2. A DC arc was ignited between the cathode 12 and the anode 14;
3. Magnetic coils 40 and 42 were activated, creating a longitudinal magnetic field and a rotating transverse magnetic field, respectively;
4. The flow rate of carrier gas was increased to 2 slm and flow rate of plasma-creating gas was increased to 200 sccm, increasing pressure in the tube 10 to 60 Torr;
5. The arc current was adjusted to increase the temperature of the substrates to the range of 1000°–1050° C.;
6. These parameters were maintained for 30 minutes for cleaning and uncarburisation of the carbide surfaces;
7. $CH_4$ was injected as a reaction species through the second inlet 22 with a flow rate of 4 sccm;

8. The arc current was adjusted to decrease the temperature of the substrates to the range of 930°–970° C.;

9. Oscillation of the longitudinal magnetic field was initiated in the range of 10 Hz to 100 KHz, and the arc current $I_c$ was oscillated with an amplitude of $\Delta I \approx 0.1 I_c$.

10. These parameters were maintained and the substrates were processed for 180 minutes for deposition of a 3 μm diamond film over the substrates;

11. Injection of the reaction species was discontinued;

12. Rotation of the magnetic field was halted;

13. The DC arc was extinguished and the magnetic fields were deactivated;

14. Injection of the carrier and plasma-creating gases was discontinued; and

15. The apparatus was opened and discharged.

Figure 14:
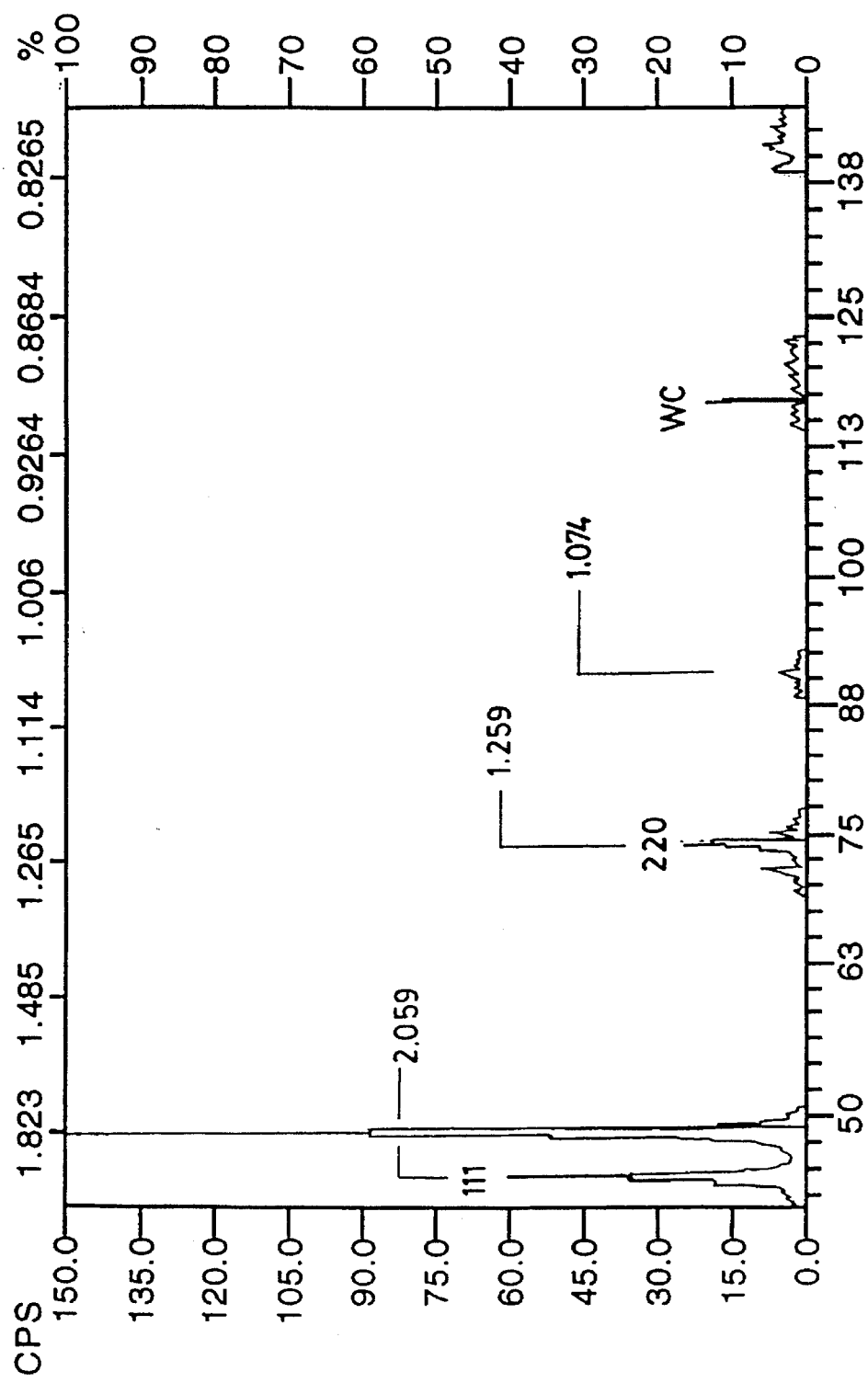
FIG. 14 illustrates the distribution of elements in the coating produced by the process of Example 2 as provided by X-ray diffraction.

The results obtained are shown below in Table 2. FIG. 14 shows the pattern of X-ray diffraction produced by the resulting diamond film. The line denoted "111" in FIG. 14 is the characteristic line for pure diamond phase.

EXAMPLE 3

In a third example, the apparatus illustrated in FIG. 5 was used. Cemented carbide drills WC-6%Co dimension 20×1 mm as substrates 2 were positioned along the wall of the tube 10 on the steel ring substrate holders 30, separated by alumina rings 32. The tube 10 was sealed and inside pressure reduced to $10^{-4}$ Torr. The method of the invention was carried out as follows:

1. Ar as a carrier gas and $H_2$ as plasma-creating gas were injected into the first inlet 20 with sufficient flow rate to increase the pressure in the tube 10 to between $1 \times 10^{-2}$ and $1.2 \times 10^{-2}$ Torr;

2. A DC arc was ignited between the cathode 12 and the anode 14;

3. Magnetic coils 40 and 42 were activated, creating a longitudinal magnetic field and a rotating transverse magnetic field, respectively;

4. The flow rate of carrier gas was increased to 2 slm and flow rate of plasma-creating gas was increased to 200 sccm, increasing pressure in the tube 10 to 20 Torr;

5. A bias AC voltage of 100V was applied to the substrate holders 30 from generator G through capacitors 27. The voltage was oscillated with a frequency range of 1 kHz to 100 kHz.

6. The arc current was adjusted to increase the temperature of the substrates to the range of 1000°–1050° C.;

7. These parameters were maintained for 30 minutes for cleaning and uncarburisation of the carbide surfaces;

8. $CH_4$ was injected as a reaction species through the second inlet 22 with a flow rate of 4 sccm;

9. The arc current was adjusted to decrease the temperature of the substrates to the range of 930°–970° C.;

10. These parameters were maintained and the substrates were processed for 180 minutes for deposition of a 3 μm diamond film over the substrates;

11. Injection of the reaction species was discontinued;

12. Rotation of the magnetic field was halted;

13. The DC arc was extinguished and the magnetic fields and bias voltage were deactivated;

14. Injection of the carrier and plasma-creating gases was discontinued; and

15. The apparatus was opened and discharged.

The results obtained are shown below in Table 3.

EXAMPLE 4

In a fourth example, the laser assisted apparatus illustrated in FIG. 6 was used. Silicon wafers dimension 20×10×1 millimeter as substrates 2 were positioned along axial substrate holders 50. The tube 10 was sealed and inside pressure was reduced to $10^{-4}$ Torr. The method of the invention was carried out exactly the same as in Example 3, except in Step 5 rather than applying an oscillating AC voltage an $Ar^+$ laser was activated with a wavelength of 488 nm.

Figure 12:
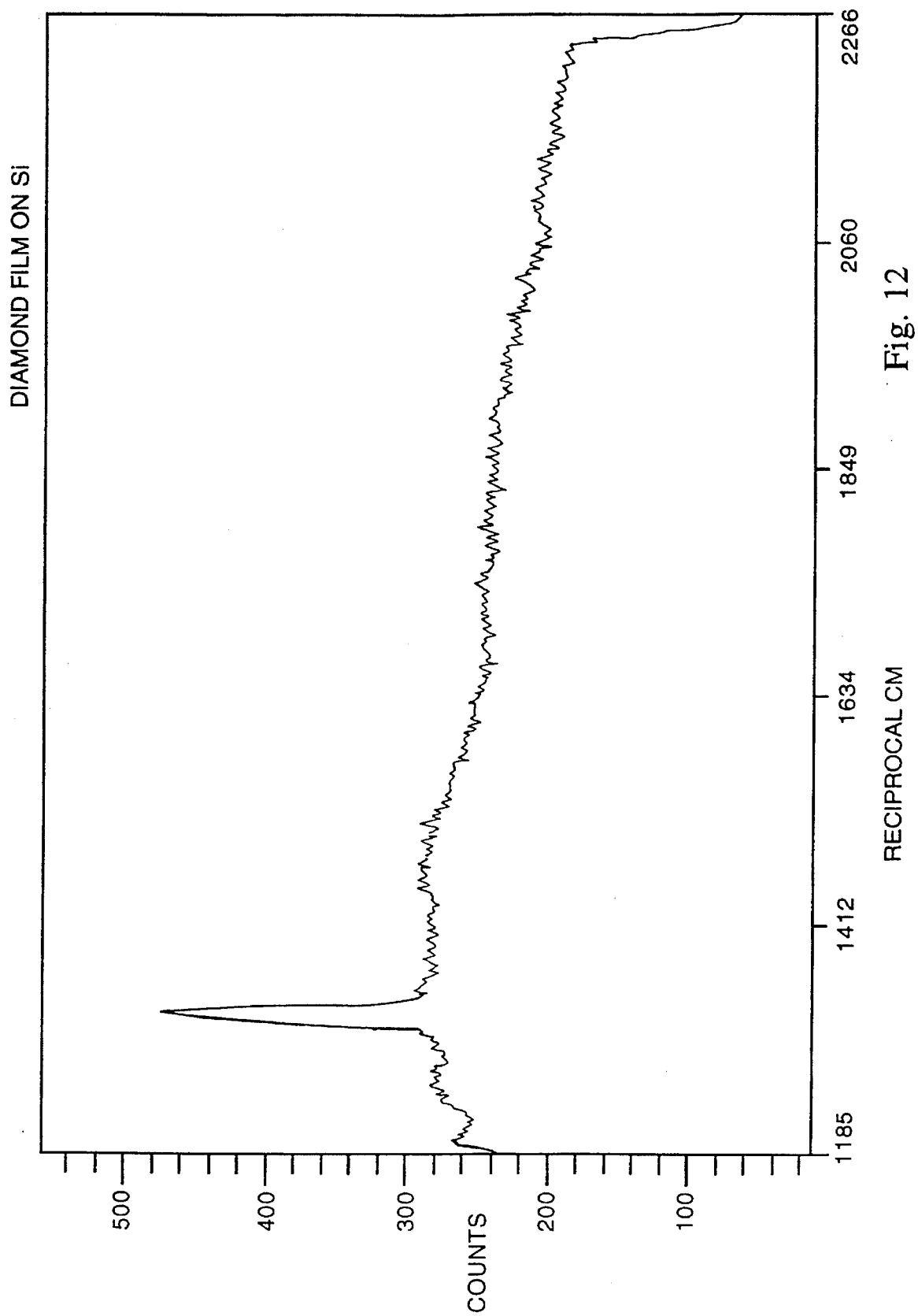
FIG. 12 is an overlay of Raman spectra of the deposit of diamond films produced by the process of Example 4.

The Raman spectra of the 10 μm diamond films produced is illustrated in FIG. 12, showing a sharp peak at a wavelength of 1330 $cm^{-1}$ corresponding to the diamond phase.

In certain applications, the reaction species must be injected as a solid powder or as liquid droplets. In such cases the powder or droplets may be injected into the stabilizing zone 16 either through the first inlet 20 or through a third inlet 44 (shown in FIG. 5) positioned so that the distance between the third inlet 44 and the beginning of the reaction zone 18 is sufficient to evaporate the solid powder or liquid droplet particles into a gaseous phase. The following two examples illustrate this variant of the process.

EXAMPLE 5

This process is based on the following reaction:

$AlCl_3(gas)+CO_2(gas)+H_2(gas)+Ar \rightarrow Al_2O_3(solid)+HCl(gas)+CO(gas)+Ar$ In this process the $AlCl_3$ gas phase was produced by sublimation of $AlCl_3$ crystals in a $CO_2+H_2+Ar$ plasma. The Ar was injected into inlet 20 at the beginning of the stabilizing zone, and the mixture of $AlCl_3$ powder with $CO_2+H_2$ into the inlet 44 in the middle of the stabilizing zone 16. The characteristic parameters of this process were:

| | |
|---|---|
| pressure | 200 Torr |
| temperature of substrates | 950–1000° C. |
| $AlCl_3$ (gas) | 3 sccm |
| $CO_2$ | 10 sccm |
| $H_2$ | 800 sccm |
| Ar | 12 slm |
| time of deposition | 3 hr. |

This process produced a 20 μm $Al_2O_3$ coating on the cemented carbide inserts.

EXAMPLE 6

This process was based on the following reaction:

$WCl_6(gas)+CH_4(gas)+H_2(gas)+Ar \rightarrow WC(solid)+H_2(gas)+HCl(gas)+C_nH_m(gas)+Ar$ In this example the $WCl_6$ gas phase was produced by sublimation of $WCl_6$ crystals in a $CH_4+H_2+Ar$ plasma. The Ar was injected into the inlet 20 and the mixture of $WCl_6$ powder and $CO_2+H_2$ was injected into the inlet 44 in the middle of the stabilizing zone 16. The characteristic parameters of this process were:

| | |
|---|---|
| pressure | 200 Torr |

-continued

| | |
|---|---|
| temperature of substrates | 600–650° C. |
| WCl$_6$ (gas) | 5 sccm |
| CH$_4$ | 3 sccm |
| H$_2$ | 800 sccm |
| Ar | 12 slm |
| time of deposition | 1 hr. |

This process produced 5 μm WC coatings on the free surface of diamond grains.

Figure 15:
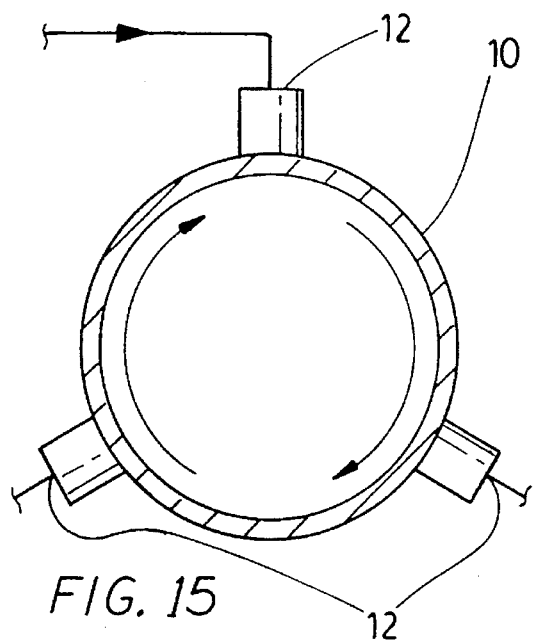
FIG. 15 is a transverse cross section of a further embodiment of the invention which utilizes a plurality of cathode-anode pairs.

Variations in the arrangement of the cathode 12 and anode 14 are available. For example, FIG. 15 illustrates an embodiment of the invention in which a plurality of cathodes 12 and anodes 14, three in the embodiment shown, are distributed around the circumference of the tube 10. This increases the durability of the apparatus. Further, by phase-shifting the signal applied to each respective cathode, the arc forms between each cathode-anode pair in turn, effectively creating an arc which rotates around the inner wall of the tube 10.

Figure 16:
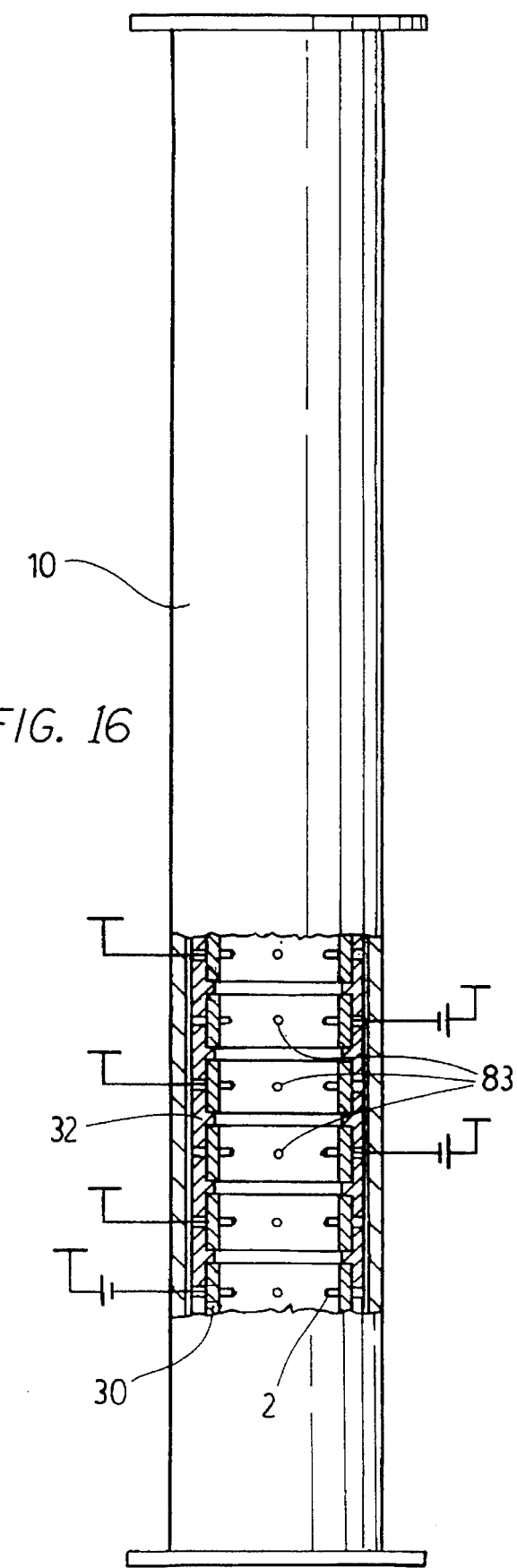
FIG. 16 is a longitudinal cross section of a further embodiment of the invention in which a plurality of cathode-anode pairs form a liner in the reaction zone for confining a plurality of arcs.
Figure 18:
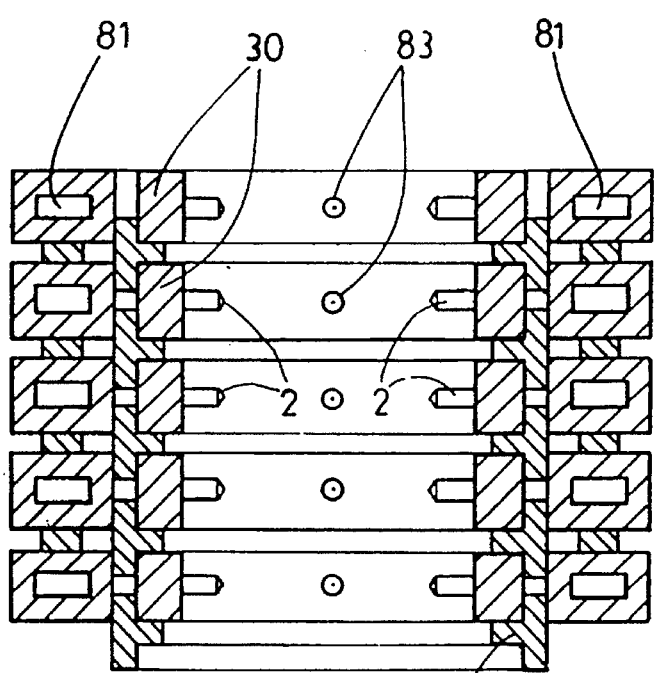
FIG. 18 is a cross section of a series of the substrate holders of FIG. 17 for a filament assisted CVD reactor embodying the invention.

FIGS. 16–18 illustrate a further embodiment of the invention having a plurality of cathode-anode pairs. In this embodiment, each alternating substrate holder is provided with a thermionic filament 83, seen in FIG. 17, which acts as a thermionic cathode. Interspersed within the filament-supporting substrate holders 30 are grounded substrate holders 30, each of which acts as an anode. When a voltage is applied an arc is created between each cathode-anode pair of adjacent substrate holders 30. In this "active wall" embodiment, because the arc columns are so short, there is no possibility of arc breakdown, i.e. short circuiting of the arc through the substrates. This embodiment may therefore have particular utility in the case of conductive substrates which exceed the "critical length" referred to above. The water-cooled substrate holders 30 illustrated in FIG. 18 may be advantageously used in this embodiment.

The invention having been thus described with reference to its preferred embodiments, it will be apparent to those skilled in the art that certain modifications and adaptations may be made without departing from the scope of invention. For example, the apparatus of the invention may be used equally effectively for sintering reactions, with the parameters of current, pressure etc. adjusted accordingly. It will also be apparent that the method and apparatus described herein can be applied to many other types of coatings beyond the examples given, for example ceramics, tungsten-carbide and other hard metals and hard films which are used for coating substrates, and the invention is in no way limited to the specific uses described.

TABLE 1

Experimental conditions for diamond coating deposition on carbide inserts.

| SAMPLE # | G$_{Ar}$,slm | G$_{H2}$,sccm | G$_{CH4}$,sccm | Total gas pressure, Torr | T$_{sub}$, C | I$_{arc}$, A | N$_{arc}$, W/cm | Time, min. | Rate, μm/hr | Coefficient of the increase in strength* |
|---|---|---|---|---|---|---|---|---|---|---|
| 1 | 2 | 200 | 5 | 40 | 930 | 24 | 48 | 120 | 0.8 | 2.8 |
| 2 | 2 | 200 | 5 | 40 | 970 | 24 | 50 | 240 | 0.8 | 3.5 |
| 3 | 2 | 200 | 5 | 40 | 960 | 24 | 50 | 240 | 0.8 | 4 |
| 4 | 1 | 150 | 5 | 20 | 920 | 23 | 47 | 240 | 0.6 | 4.8 |
| 5 | 1 | 150 | 5 | 20 | 1010 | 26 | 54 | 240 | 0.6 | 5.4 |
| 6 | 3 | 200 | 5 | 30 | 1050 | 28 | 58 | 240 | 0.7 | 2.2 |
| 7 | 3 | 200 | 5 | 30 | 990 | 25 | 49 | 240 | 0.7 | 2.9 |
| 8 | 2 | 200 | 5 | 30 | 1020 | 27 | 55 | 600 | 0.7 | 7.1 |
| 9 | 2 | 200 | 5 | 40 | 1040 | 28 | 58 | 600 | 1 | 8.8 |
| 10 | 2 | 200 | 5 | 40 | 1050 | 28 | 58 | 600 | 1 | 9.3 |

*For testing these inserts the material treated was Al- 18% Si alloy.

TABLE 2

Experimental conditions for diamond coating deposition on carbide drills with oscillating power assistant.

| SAMPLE # | G$_{Ar}$,slm | G$_{H2}$,sccm | G$_{CH4}$,sccm | Total gas pressure, Torr | T$_{sub}$, C | I$_{arc}$, A | N$_{arc}$, W/cm | N$_\sim$, W/cm* | Time, min. | Coefficient of the increase in strength* |
|---|---|---|---|---|---|---|---|---|---|---|
| 1 | 2 | 200 | 5 | 25 | 1000 | 24 | 48 | — | 120 | 1.8 |
| 2 | 2 | 200 | 5 | 25 | 1000 | 24 | 48 | — | 240 | 2.5 |
| 3 | 2 | 200 | 5 | 25 | 1030 | 24 | 48 | 3 | 240 | 3 |
| 4 | 2 | 200 | 5 | 25 | 1030 | 24 | 48 | 7 | 240 | 3.8 |
| 5 | 2 | 200 | 5 | 25 | 1050 | 24 | 48 | 12 | 240 | 4.4 |
| 6 | 2 | 150 | 5 | 25 | 920 | 20 | 42 | — | 120 | 2.2 |
| 7 | 2 | 150 | 5 | 25 | 920 | 20 | 42 | — | 240 | 2.9 |

TABLE 2-continued

Experimental conditions for diamond coating deposition on carbide drills with oscillating power assistant.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | $N_\sim$, W/cm* | Time, min. | Coefficient of the increase in strength* |
|---|---|---|---|---|---|---|---|---|---|---|
| 8 | 2 | 150 | 5 | 25 | 940 | 27 | 42 | 3 | 240 | 4.1 |
| 9 | 2 | 150 | 5 | 25 | 950 | 28 | 42 | 5 | 240 | 4.8 |
| 10 | 2 | 150 | 5 | 25 | 950 | 28 | 42 | 10 | 240 | 5.3 |

*For testing these drills the material treated were bases for printed circuit boards made of glass fabric resin foil with protective lac coating.
**The specific oscillating power was calculated from the ratio $c = (\langle I_\sim \rangle / i_{arc})^2$, where $\langle i_\sim \rangle$ is mean amplitude of the oscillating part of arc current with frequency in the range 10 Hz- 100 kHz. Then $N_\sim = cN_{arc}$.

TABLE 3

Experimental conditions for diamond coating deposition on carbide drills with AC bias power assistant.

| SAMPLE # | $G_{Ar}$, slm | $G_{H2}$, sccm | $G_{CH4}$, sccm | Total gas pressure, Torr | $T_{sub}$, C | $I_{arc}$, A | $N_{arc}$, W/cm | $V_{bias}$, V** | Time, min. | Coefficient of the increase in strength* |
|---|---|---|---|---|---|---|---|---|---|---|
| 1 | 2 | 200 | 5 | 25 | 1000 | 24 | 48 | — | 120 | 1.8 |
| 2 | 2 | 200 | 5 | 25 | 1000 | 24 | 48 | — | 240 | 2.5 |
| 3 | 2 | 200 | 5 | 25 | 1050 | 24 | 48 | 20 | 240 | 3.4 |
| 4 | 2 | 200 | 5 | 55 | 1040 | 24 | 48 | 50 | 240 | 4 |
| 5 | 2 | 200 | 5 | 25 | 1060 | 24 | 48 | 100 | 240 | 4.6 |
| 6 | 2 | 150 | 5 | 25 | 920 | 20 | 42 | — | 120 | 2.2 |
| 7 | 2 | 150 | 5 | 25 | 920 | 20 | 42 | — | 240 | 2.9 |
| 8 | 2 | 150 | 5 | 25 | 960 | 27 | 42 | 20 | 240 | 3.8 |
| 9 | 2 | 150 | 5 | 25 | 990 | 28 | 42 | 50 | 240 | 5.1 |
| 10 | 2 | 150 | 5 | 25 | 990 | 28 | 42 | 100 | 240 | 5.8 |

*For testing these drills the material treated were bases for printed circuit boards made of glass fabric resin foil with protective lac coating.
**The frequency for bias potential was 50 kHz.

I claim:

1. An arc assisted coating apparatus comprising
   a tube having a reaction zone and at least one inlet for injection of a carrier gas, a plasma-creating gas and a reaction species,
   a cathode located upstream of the reaction zone,
   an anode located downstream of the reaction zone, and
   one or more substrate holders positioned within the reaction zone for supporting a substrate to be coated,
   whereby a wall of the one or more substrate holders acts as a liner to confine an arc created between the cathode and the anode.

2. The apparatus of claim 1 including a plurality of substrate holders and in which the substrate holders are annular and aligned to form a plasma channel for confining the arc within the substrate holders.

3. The apparatus of claim 2 in which the substrate holders are electrically conductive and the axial length $l_s$ of each substrate holder is governed by the formula $$l_s < \frac{V_c + V_a}{E_c}$$

where
   $V_c$ is the voltage of the cathode,
   $V_a$ is the voltage of the anode, and
   $E_c$ is the charge of the electric field created in the arc column.

4. The apparatus of claim 3 wherein the substrate holders are separated by dielectric spacers.

5. The apparatus of claim 2 wherein the substrate holders form self contained reaction sections, each section being provided with an inlet, a gas outlet, a cathode and an anode.

6. The apparatus of claim 5 wherein one or more substrate holders are suspended along an axis of the reaction sections by a dielectric filament.

7. The apparatus of claim 1 including a plurality of substrate holders and in which the substrate holders comprise blocks each having an outer wall, wherein the substrate holders are aligned axially along the tube to form a liner for confining the arc between the substrate holders and an inner wall of the tube.

8. The apparatus of claim 7 in which the substrate holders are electrically conductive and the axial length $l_s$ of each substrate holder is governed by the formula $$l_s < \frac{V_c + V_a}{E_c}$$

where
   $V_c$ is the voltage of the cathode,
   $V_a$ is the voltage of the anode, and
   $E_c$ is the charge of the electric field created in the arc column.

9. The apparatus of claim 8 wherein the substrate holders are separated by dielectric spacers.

10. The apparatus of claim 8 including at least one magnetic coil for creating a transverse magnetic field to bias a plasma column toward the periphery of the reaction zone.

11. The apparatus of claim 10 wherein the transverse magnetic field is varied to rotate the plasma column around a periphery of the reaction zone.

12. The apparatus of claim 8 wherein a substrate holder or a plurality of substrate holders are suspended along an axis of the tube by a dielectric filament.

13. The apparatus of claim 1 including means for applying a bias potential to substrate holders supporting the substrates.

14. The apparatus of claim 1 including generating means for injecting an oscillating electromagnetic field into a plasma column created within the tube.

15. The apparatus of claim 12 in which the ends of the tube are transparent and including a laser resonator comprising a laser and a pair of mirrors disposed on the upstream and downstream ends of the tube, respectively, to reflect light along the axis of the tube.

16. The apparatus of claim 14 including a microwave generator, wherein the tube is provided with a dielectric liner to protect an inner wall of the tube, and wherein a channel formed within the substrate holders serves as a microwave waveguide.

17. The apparatus of claim 14 including an electrode for injecting an RF electromagnetic signal into the tube.

18. The apparatus of claim 1 wherein the tube is cylindrical and the inlets enter the tube tangentially.

19. The apparatus of claim 1 wherein the tube is rotatable.

20. The apparatus of claim 1 wherein the diameter of the reaction zone is between 1 cm and 10 cm.

21. The apparatus of claim 1 wherein one or more substrate holders is provided with a thermionic filament composed of a refractory material.

22. A method of depositing a coating on a substrate, comprising the steps of positioning a substrate in a cylindrical reaction zone within the tube and reducing pressure in the tube, injecting a carrier gas and a plasma creating gas into the tube upstream of the reaction zone and upstream of an inlet for injecting a reaction species, injecting a reaction species into the tube upstream of the reaction zone, creating an electric arc between a cathode upstream of the reaction zone and an anode downstream of the reaction zone, with the arc contacting the substrate, activating a magnetic field to bias a plasma column created by the arc toward the substrate.

23. The method of claim 22 for synthesizing a coating of diamond or cubic boron nitride, wherein the carrier gas is argon or another inert gas, the reaction gas comprises hydrogen plus a chemical species including carbon for creating a diamond film or hydrogen and boron plus nitrogen for creating a cubic boron nitride film, the pressure in the tube is reduced to the range of 10 to 1000 Torr and the specific power of the electric arc is between 0.1 $W/cm^3$ and 50 $W/cm^3$.

* * * * *